United States Patent [19]
Casavant et al.

[11] Patent Number: 5,175,843
[45] Date of Patent: Dec. 29, 1992

[54] COMPUTER-AIDED DESIGN METHOD FOR RESTRUCTURING COMPUTATIONAL NETWORKS TO MINIMIZE SHIMMING DELAYS

[75] Inventors: Albert E. Casavant; Richard I. Hartley, both of Schenectady, N.Y.

[73] Assignee: General Electric Company, Schenectady, N.Y.

[21] Appl. No.: 428,808

[22] Filed: Oct. 30, 1989

[51] Int. Cl.⁵ .............................................. G06F 9/00
[52] U.S. Cl. ............................ 395/500; 364/DIG. 1; 364/271.5; 364/259; 364/259.1
[58] Field of Search ... 364/200 MS File, 900 MS File, 364/491; 395/500

[56] References Cited
U.S. PATENT DOCUMENTS

| | | | |
|---|---|---|---|
| 3,978,452 | 8/1976 | Barton et al. | 364/200 |
| 4,447,875 | 5/1984 | Bolton et al. | 364/200 |
| 4,654,780 | 3/1987 | Logsdon et al. | 364/200 |
| 4,734,848 | 3/1988 | Yamano et al. | 364/200 |
| 4,827,428 | 5/1989 | Dunlop et al. | 364/491 |
| 4,942,396 | 1/1990 | Hartley et al. | 341/101 |
| 4,956,773 | 9/1990 | Saito et al. | 364/200 |

*Primary Examiner*—Lawrence E. Anderson
*Assistant Examiner*—Mehmet Geckil
*Attorney, Agent, or Firm*—Marvin Snyder

[57] ABSTRACT

A computer-aided design method for restructuring computational networks to minimize latency and shim delay, suitable for use by a silicon compiler. Data-flow graphs for computational networks which use trees of operators, each performing associative and commutative combining of its respective imput operands to generate a respective output operand, are converted to data-flow graphs with multiple-input operators. Data-flow graphs with multiple-input operators, after being optimally scheduled, are converted to data-flow graphs which use trees of dual-input operators or of dual-input and three-input operators, those trees having minimum latency and shim delay associated with them. These data-flow graphs then have shim delay minimized in them, e.g. by being subjected to linear programming.

15 Claims, 13 Drawing Sheets

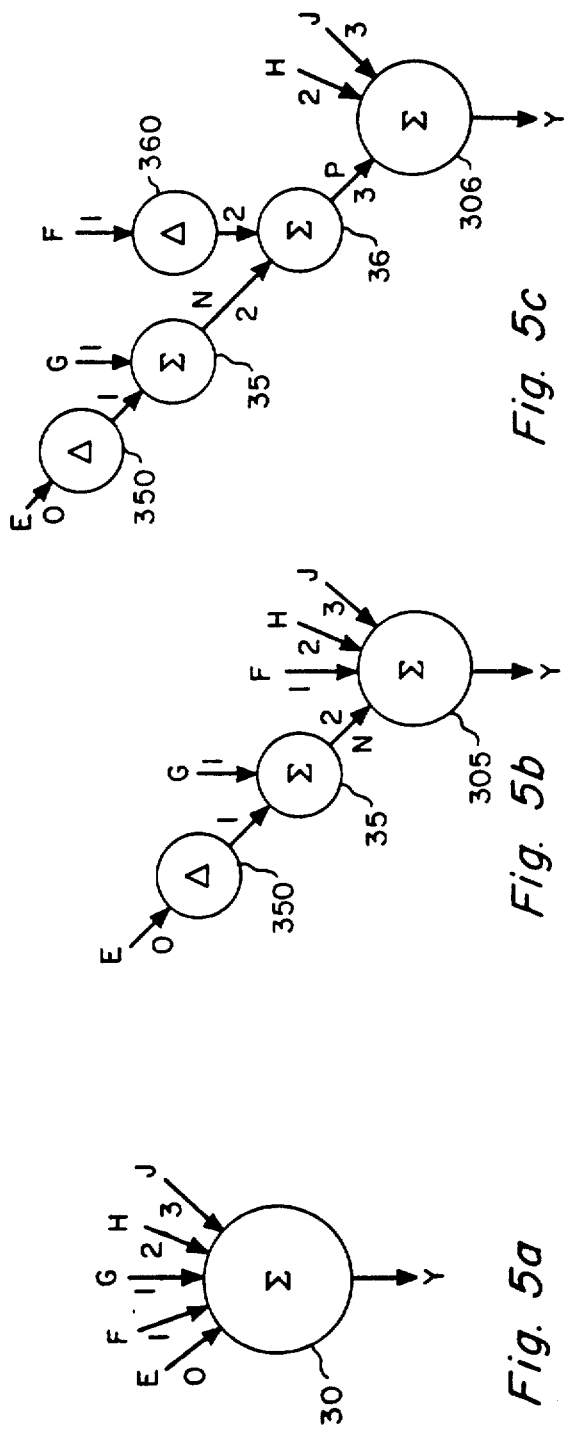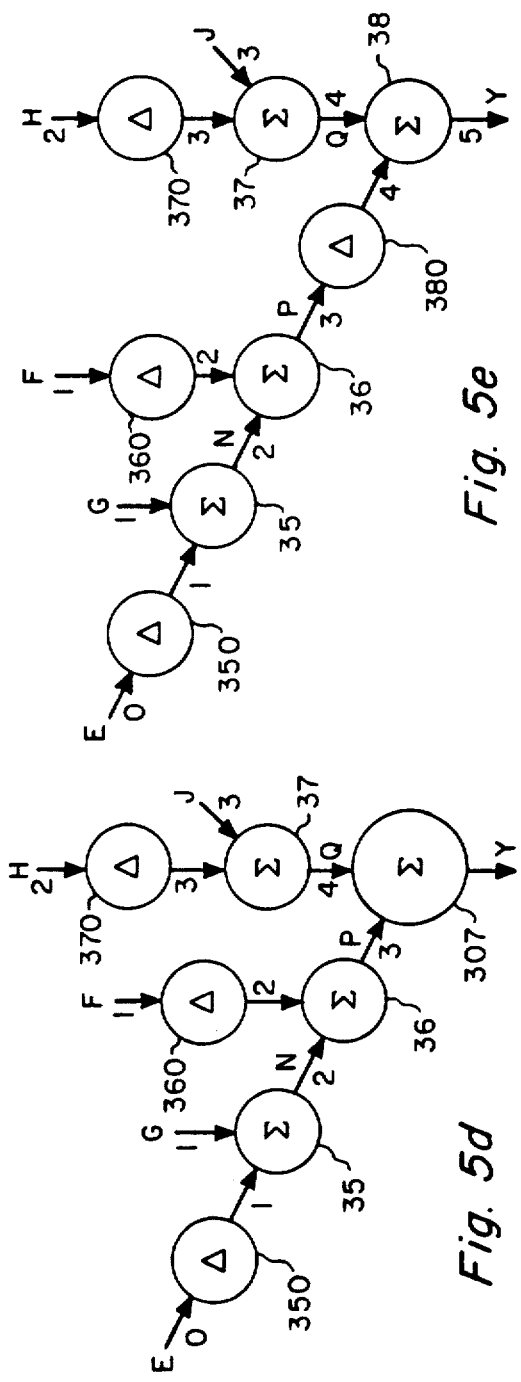
Fig. 5a
Fig. 5b
Fig. 5c
Fig. 5d
Fig. 5e

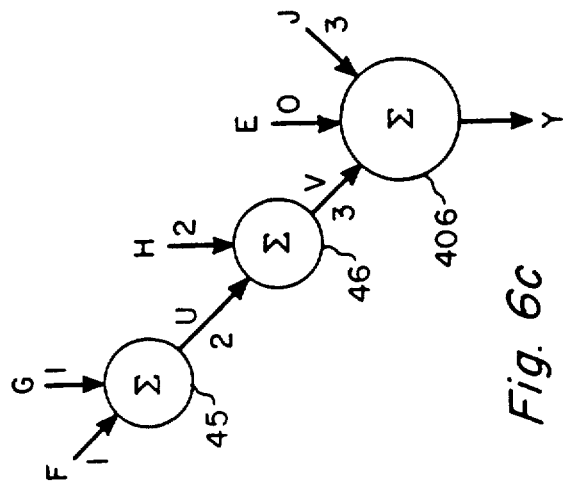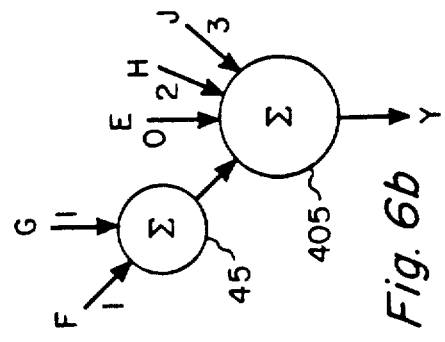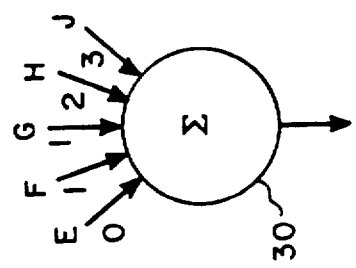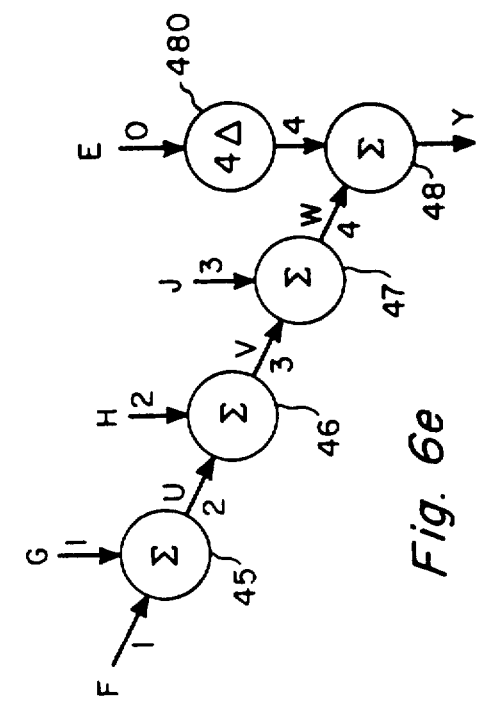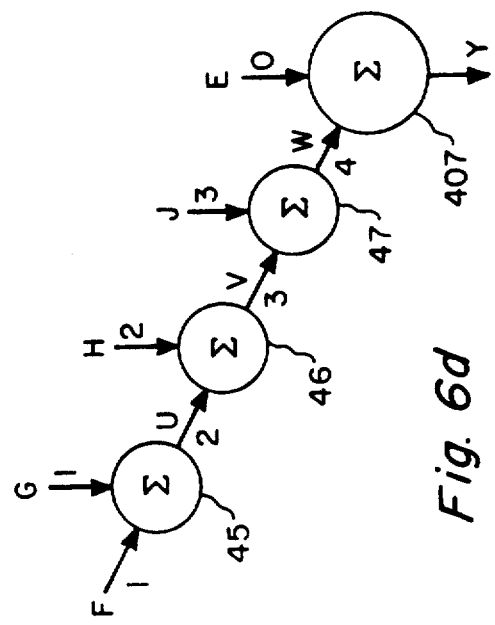

COMPUTER-AIDED DESIGN METHOD FOR RESTRUCTURING COMPUTATIONAL NETWORKS TO MINIMIZE SHIMMING DELAYS

The invention relates to minimizing latency and shimming delay in sampled-data processing done in computational networks including tree connections of commutative and associative operators within a synchronous data-flow architecture.

BACKGROUND OF THE INVENTION

An example of such computational networks is found in time-domain digital filters. Such filters are commonly constructed within the confines of monolithic integrated circuits.

Computers using programs called "silicon compliers" can determine how electronic circuitry is to be disposed within the confines of a monolithic integrated circuit die. The silicon compiler begins with a behavioral description of the electronic circuitry and proceeds to design the masks used for implementing the photolithographic processes used to manufacture the monolithic integrated circuits used to implement that electronic circuitry. In this design process the silicon compiler constructs the design relying on a library of standard circuit designs which are interconnected using suitable intervening delay elements. This construction begins with the design being considered in data-flow graph terms, after which the design is converted to descriptions of standardized cells of integrated circuitry that are oriented vis-a-vis each other using tiling algorithms. When a suitable tiling of the standard cells is decided upon by the silicon compiler, full mask sets for the photolithographic processes are generated in accordance with further software in the silicon compiler.

In the design by the silicon compiler of monolithic integrated circuits that function synchronously, in accordance with shared clocking signals, an important aspect of the design procedure is the minimization of delays through a network of computational elements. There is a desire to reduce "latency", or the time it takes for a response to appear at an output port of the computational network after a stimulus is applied to an input port of the network. Latency is expressed in terms of clock cycles in digital computational networks, which are the computational networks of primary interest in regard to the invention. Often delay has to be inserted into a signal path through the network to synchronize a signal arriving too early with a signal that arrives later, so that the signals can be processed together with each other. Such delay is referred to as "shimming" delay or "shim" delay. In the interest of conserving digital hardware, particularly in large networks, it is desirable to minimize the need for shim delay.

In the prior art the problems of minimizing latency and shimming delay have been dealt with by means of linear programming. See the paper "Behavioral to Structural Translation in a Bit-Serial Silicon Compiler" by R. I. Hartley and J. R. Jasica appearing in IEEE TRANSACTIONS ON COMPUTER-AIDED DESIGN, Vol. 7, No. 8, pp. 877–886 (August 1988) and the earlier paper "An Optimal and Flexible Delay Management Technique for VLSI" by G. Goosens, R. Jain, J. Vandewalle and H. deMan in PROCEEDINGS, INTERNATIONAL SYMPOSIUM, MATHEMATICAL THEORY OF NETWORKS AND SYSTEMS (Stockholm, 1985). To facilitate linear programming, a structural description of the network called a data-flow graph is prepared by the silicon compiler. The data-flow graph is described in the Hartley and Jasica paper as a bipartite directed graph that has vertices (or nodes) representing operators and operands and has between these vertices directed edges showing the direction of data flow. "Operators" correspond to respective processing elements and "operands" correspond to respective signals the elements process. An operator node in the data-flow graph may, in general, have any number of inputs and any number of outputs. An operand node may have any number of outputs (fan-out), but only one input, because each operand is the output of a single operator. A respective input operator is introduced as the source of each input operand, to assure conformity to this rule. Many data-flow graphs incorporate digital word delay operators.

For a computational network to operate properly, each operator in the circuit must be accorded a "scheduled time" consistent with the timing constraints placed on its associated operands. That is, each of the input operands to the operator must be available at (or before) the scheduled time accorded that operator. The scheduled time of an operator and the processing delays through the operator after all its input operands are available determine a "ready time" for each output operand of the operator. The scheduled time for an operator is invariably as late as the (last) ready time for the operand(s) supplied as input operand(s) to it. Procedures for scheduling the operators in a network and determining the ready times for the output operands of each operator (which may be the input operands for succeeding operators) are known in the prior art and are described in the Hartley and Jasica paper, which description is incorporated herein by reference.

Alternatively, the data-flow graph can be represented as a directed hyper-graph having vertices (or nodes) corresponding to the operators and having hyper-edges corresponding to operands flowing between operators. A hyper-edge has one input vertex, the source of a respective operand, and as many output vertices as there are operators receptive of that respective operand. Again operators can have any number of input operands and usually have one output operand. This latter representation of the data-flow graph has recently tended to supplant the representation in the Hartley and Jasica paper, but differences between the representations are a matter of form rather than substance.

Procedures for scheduling the operators in a computational network can be adapted to include modification of the topology of the network of operators, it is pointed out. An objective of the invention is to modify the topology of the operators so as to provide improvements in scheduling—namely, reduced latency and savings in shimming delay. Trees of dual-input operators for performing processes that are associative and commutative in nature—e.g., adders—are often encountered in computational networks. Or, such trees can be obtained by using simple manipulations of the network structure, such as converting adder and subtractor trees to adder trees by taking advantage of signed arithmetic. Rearrangement of these trees of dual-input operators can provide improvements in the scheduling of operators in computational networks, as it intuitively apparent from the metal efforts of experts in digital filter design with regard to reducing digital filter hardware. The inventors have attempted simply to use linear programming techniques for rearranging networks including trees of dual-input operators, in order to minimize delay in the rearranged network. This direct approach has not been successful, however.

A key to successfully rearranging the networks for minimal delay has been found by the inventors to be replacement of the tree of dual-input operators by an equivalent multiple-input operator, which is then converted to a tree structure that has minimal delay. Where there is at least one loop in the network which includes the multiple-input operator, optimization of the scheduling of the operator in the modified network is done, which is likely to change the ready times of the input operands of the multiple-input operator, thus to require that a new minimal delay tree of dual-input operators must be considered. The rescheduling and construction of minimum-delay trees of dual-input operators continues until optimum scheduling is assured. The resulting network can then be further optimized using normal linear programming techniques. The problem of performing rearrangement of a tree of dual-input operators using linear programming is reformulated in the invention so that the problem is in large part a problem of synthesizing a minimal-delay tree of operators, which latter problem is tractable, especially if the dual-input operators used for constructing the tree are of a type that accept input operands concurrently.

There has been work done with regard to tree-height minimization in the context of software compilers for multi-processors. A summary of early work and an optimal algorithm for producing a minimum number of ranks (or levels) in trees containing multipliers, adders, subtractors, dividers, exponentiation operators and unary minus operators appears in the J. L. Baer and D. P. Bovet paper "Compilation of Arithmetic Expressions for Parallel Computations" appearing in pages 340-346 of IFIP 68, North Holland Publishing Co., Amsterdam, 1969. Parenthesized sub-expressions are also handled. This algorithm, based on the associative and commutative properties of operators, parses infix expressions and exploits precedences specified for each type of operator. Each operation is assumed to require one time unit and all input operands arrive at the leaves of the expression trees simultaneously, as would be the case for operands residing in respective registers of a programmable computer. The number of levels in the resulting tree is minimized, with one pass over the expression being required for each level of the tree generated by the algorithm. J. C. Beatty's paper "An Axiomatic Approach to Code Optimization for Expressions", appearing in Journal of the Association for Computing Machinery pages 613-640, Vol. 19, No. 4, October 1972 extends the Baer and Bovet algorithm to take into account parameterized operator delays, and a proof of optimality is offered. An overview of tree-height minimization techniques including the use of the distributive property, appears in pages 67-107 of the book ALGORITHMS, SOFTWARE AND HARDWARE OF PARALLEL COMPUTERS, edited by J. Miklosko and V. E. Kotov, and published by Springer-Verlag, Berlin, N.Y., 1984. Complete consideration of tree-height minimization takes into account factoring and the distributive properties of operators, as well as their associative and commutative properties.

SUMMARY OF THE INVENTION

An objective of the invention is to improve a computer-aided design method for reducing delay in a computational network comprised of operators, which method employs steps of earliest scheduling of operators and linear programming to minimize shimming delay, where the operators include ones for performing associative and commutative operations. This improvement is provided by the further step of modifying the topology of the network in regard to the operators for performing associative and commutative operations, so as to provide savings in latency and shimming delay. A primary aspect of the invention is a method for restructuring a computational network of clocked operators to reduce delay therein and thereby reduce the number of clock cycles to perform a schedule of operations, which method includes the steps of: generating a data-flow graph descriptive of the computational network prior to its restructuring, which data-flow graph indicates the relationships of operands and operators in the network; modifying that first data-flow graph to generate a modified data-flow graph by searching out each plural-input operator having a fan-out of one to an operator of similar type and replacing those operators with an equivalent multiple-input operator, until such replacements can no longer be made; rescheduling operators in the modified data-flow graph to obtain the earliest schedule therefor; further modifying the modified data-flow graph by replacing multiple-input operators with trees of dual-input operators which trees exhibit minimal delay; subjecting the further modified data-flow graph to linear programming that minimizes shim delays and constructing a reconstructed clocked computational network as described by said final data-flow graph.

Further aspects of the invention are routines for generating trees of operators which exhibit minimal delay. These routines take into account differential delays among operands that are likely to arise because of scheduling optimization in portions of the network preceding a tree of operators.

BRIEF DESCRIPTION OF THE DRAWINGS

FIG. 5a is a diagram showing the same multiple-input adder and FIGS. 5b, 5c, 5d and 5e are diagrams illustrating an alternative set of steps for constructing, again in accordance with aspects of the invention a tree of dual-input adders that has minimal latency and shim delay.

FIG. 6a is a diagram showing a multiple-input adder and FIGS. 6b, 6c, 6d and 6e are diagrams illustrating the steps for constructing in accordance with an aspect of the invention a tree of dual-input adders that has minimal latency and shim delay.

DETAILED DESCRIPTION OF THE INVENTION

The invention is particularly well-suited to bit-serial and digit-serial pipelined architectures for digital computation, where arithmetic and logical operations take place at regular clocking intervals, where shim delays are often necessary and where loops with lengths greater than zero may be encountered in manipulating the data-flow graphs. Shim delay is delay provided for an operand which is to be used in an operation which must be postponed because the operation requires other operands not yet available.

In a bit-serial architecture, each clock cycle advances each successive bit of a plural-bit word, one stage in the pipeline, and a word delay will consist of as many clock cycles as there are bits in a word. In a digit-serial architecture, each word consists of a succession of parallel-bit digits; each clock cycle advances the plural bits of a digit one stage in the pipeline; and a word delay will consist of as many clock cycles as there are digits in a word. A stream of bit-serial or digit-serial data will be accompanied by a flag signal that implements parsing the data into words.

As a preliminary step in the description of the invention, the advantages of rearranging trees of operators that are of a type for associatively and commutatively combining data will be considered. Operators associated with signed addition are of such type in bit-serial and digit-serial computation; and trees of these operators are used, by way of example, in digital time-domain filters.

Subfigures (a) and (b) of FIG. 1 show two adder trees each comprising four adders 11, 12 and 13 that additively combine four concurrent, independent input variables A, B, C and D to provide their sum X as dependent output variable. The adders 11, 12 and 13 are each presumed to have a latency of one clock cycle $\Delta$.

Figure 1A:
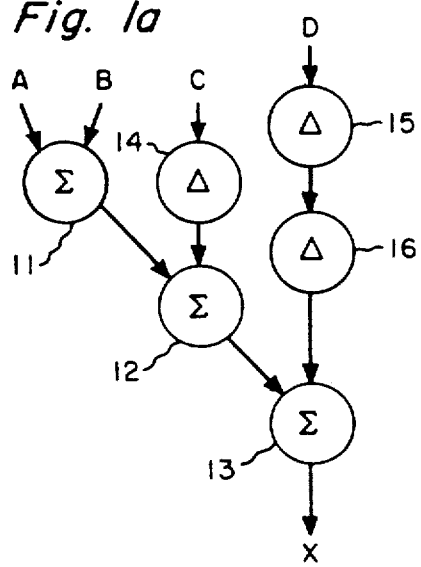
FIGS. 1a-1b are schematic diagrams of two adder trees, which are compared with regard to latency and shimming delay.

The chain adder of FIG. 1(a) requires one single-clock-cycle shim delay 14 for one of its input variables, shown as being C, and two single-clock-cycle shim delays 15 and 16 for another of its input variables shown as being D. The chain adder of FIG. 1(a) has a latency of 3$\Delta$ between any of its input connections receiving one of the independent input variables A, B, C and D and its output connection supplying the dependent output variable X.

Figure 1B:
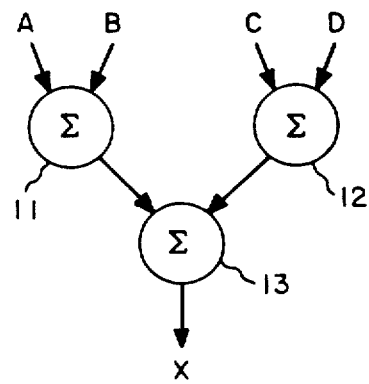

The balanced-tree adder of FIG. 1(b) has no shim delays. It has a latency of only 2$\Delta$ between any of its input connections receiving one of the variables A, B, C and D and its output connection supplying variable X. Clearly the balanced-tree adder of FIG. 1(b) is the preferable configuration.

This is so even where a latency of 3$\Delta$ is needed to meet network requirements, since adding a $\Delta$ shim delay for X at the output connection of the FIG. 1(b) adder is more economical of digital hardware than using the FIG. 1(a) adder with three single-clock-cycle shim delays 15-17. This is illustrative of a general principal that where two inputs to an adder are delayed, it saves digital hardware to replace that adder and equal amounts n$\Delta$ of input delay with an adder having input delays decreased by n$\Delta$ and output delay increased by n$\Delta$. Here, n is a positive integer.

The comparisons between various adder tree structures become more difficult when the number of input variables is not an integral power of two and when the input variables do not occur concurrently in time. In such instances balanced adder tree structures will not necessarily be the best topological structures for a computational network. Furthermore, while a human circuit designer can use a variety of strategies to arrive at a tree structure that he can assure himself is optimal, there is a need for a design strategy that proceeds directly to a tree structure that is as good as can be achieved, which strategy can be implemented by a silicon compiler.

FIG. 2 has a subfigure (a) showing a recursive digital filter that is incapable of being scheduled by a silicon compiler and a subfigure (b) showing a recursive digital filter that has the same response characteristic but is capable of being scheduled. Rearrangement of the adder tree permits the scheduling in the latter case. The recursive filters of FIG. 2 use bit-serial operators to process sixteen-bit words. The filter provides response y to stimulus x and can be described by the following equation:

$$y = a_1 * y\{-1\} + a_2 * y\{-2\} + a_3 * y\{-3\} + x$$

wherein:
the asterisk indicates a multiplication operation
$y\{-1\}$ is the response sample one word previous to y,
$y\{-2\}$ is the response sample one word previous to $y\{-1\}$, and
$y\{-3\}$ is the response sample one word previous to $y\{-2\}$.

The term $y\{-n\}$ is the general notation used to represent the $n^{th}$ previous value of a variable y. In the data flow graph the passage to a previous value is denoted by a "pseudo-operator" denoted by $Z^{-1}$. The $Z^{-1}$ operator is assumed to have a latency $-N$ where N is the number of clock cycles taken up by a data word. The rationale behind this is that if an operand y arrives at $Z^{-1}$ operator at time zero, then the output operand $y\{-1\}$, the previous value of y, was ready one data word or N clock cycles before. It follows that the $Z^{-1}$ operator has a latency of $-N$ clock cycles. In computing bit-serial and digit-serial architectures, the $Z^{-1}$ operator is used for scheduling purposes only and is removed once scheduling is done and shim delays are inserted. Except in considering bit-parallel architectures where the $Z^{-1}$ operator corresponds to a word latch, the $Z^{-1}$ operator does not correspond on a one-to-one basis to an actual hardware element, which is the reason for classifying it as a "pseudo-operator".

Addition operators 21, 22 and 23 have a latency of one clock cycle, or bit time. Multiplication-by-a-constant operators 24, 25 and 26 are presumed to have a latency of fifteen clock cycles, or bit times, although the actual latency of such a bit-serial multiplier depends on the value of the constant multiplier. One-word-delay elements 27, 28 and 29 have a latency of −16.

Figure 2A:
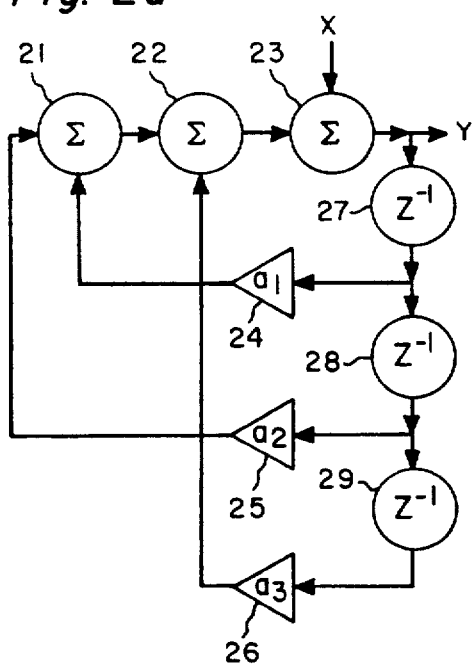
FIGS. 2a-2b are schematic diagrams of two recursive filters which a silicon compiler respectively cannot schedule and can schedule for bit-serial implementation.

In the FIG. 2(a) filter the loop containing elements 21, 22, 23, 27 and 24 has a cumulative latency of $1+1+1-16+15=2$, which exceeds zero. A loop having a latency in excess of zero cannot be scheduled since it presumes an output could be generated in the opened loop before input is applied, which is not possible.

Figure 2B:
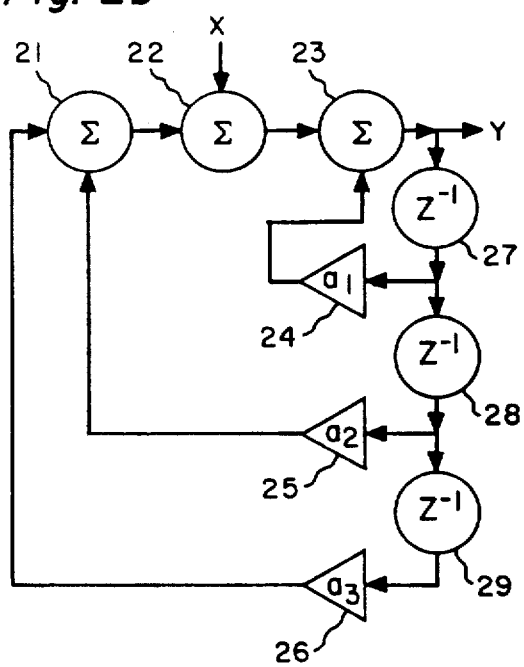

In the FIG. 2(b) filter the loop containing elements 23, 27 and 24 has a cumulative latency of $1-16+15=0$. The loop containing elements 21, 22, 23, 27, 28 and 25 has a comulative latency of $1+1+1-16-16+15=-14$. The loop containing elements 21, 22, 23, 27, 28, 29 and 26 has a cumulative latency of $1+1+1-16-16-16+15=-30$. In the FIG. 2(b) filter, then, there is no impediment to scheduling caused by comulative latency around a loop exceeding zero.

Figure 3:
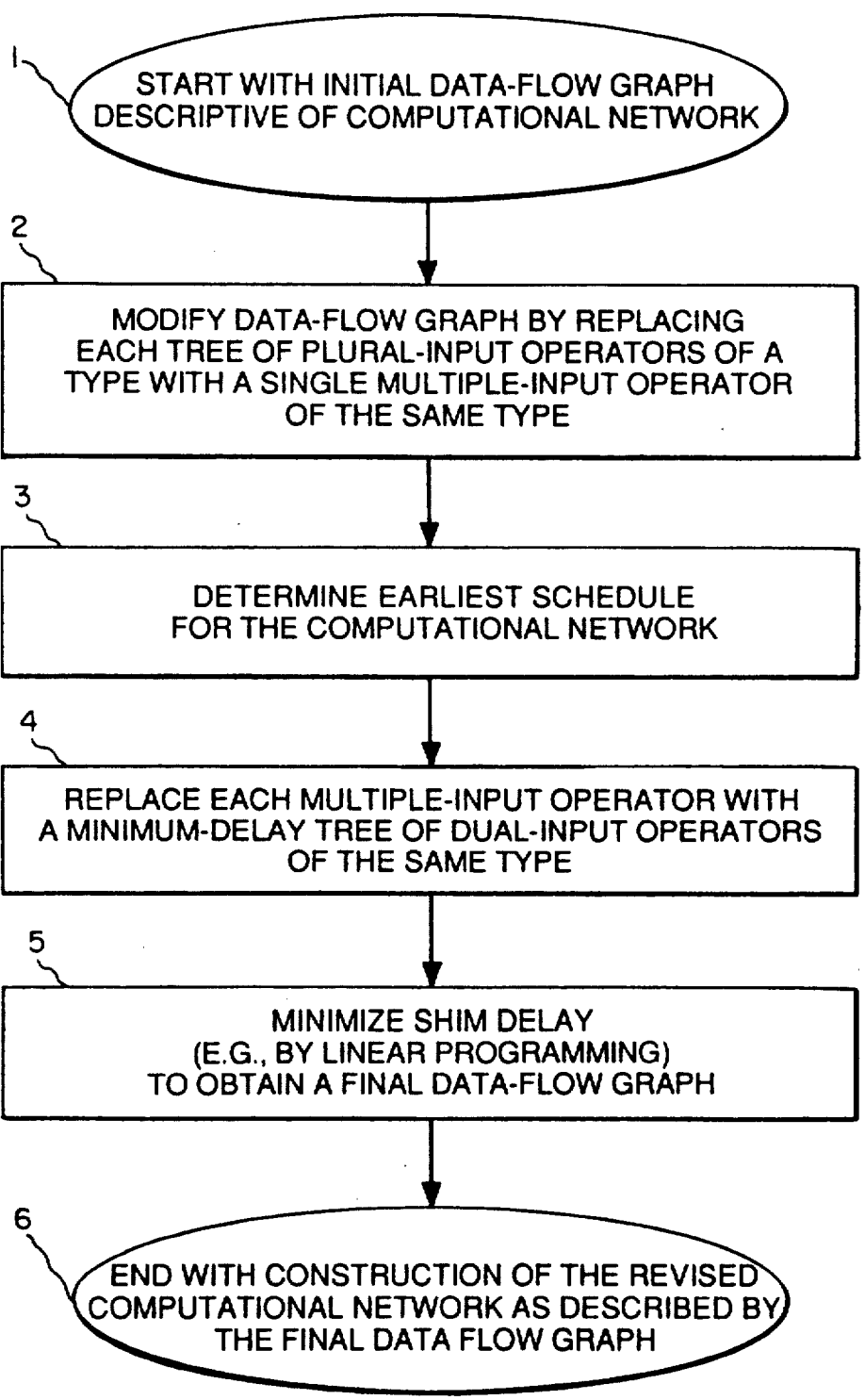
FIG. 3 is a flow chart depicting the method for reconstructing an electrical network of clocked operators that is a primary aspect of the invention.

FIG. 3 is a flowchart depicting the method for restructuring a computational network of clocked operators to reduce the delay therein, which method embodies a primary aspect of the invention. To start, as shown in start step 1 of the method depicted in FIG. 3, a data-flow graph of the computational network is obtained prior to the restructuring of the network. Subsequently, in step 2 of the method, the data-flow graph is modified replacing each tree of dual-input operators of the same type with a single multiple-input operator. To perform this modification, each plural-input operator having a fan-out of one to a plural-input operator of similar type is searched out, and the connection of those plural-output operators is identified as a tree, which tree is replaced by a multiple-input operator, until such replacements can no longer be made. The algorithm may be described as follows.

ALGORITHM FOR REPLACING EACH TREE OF PLURAL-INPUT OPERATORS OF A GIVEN TYPE WITH A SINGLE MULTIPLE-INPUT OPERATOR OF THAT GIVEN TYPE:

While not finished:
  BEGIN;
  find an operator $O_1$ that is a plural-input operator of said given type;
  if $O_1$ has a fan-out equal to one, and if the fan-out is to an operator $O_2$ that is a plural-input operator of said given type, then delete $O_1$ and $O_2$, replacing them with a multiple-input operator $O_3$ of said given type, which operator $O_3$ is receptive of all the inputs of the deleted operators $O_1$ and $O_2$;
  END.

Note that plural-input operators that have a fan-out greater than one are not replaced. The output of such an operator is an operand that is used by more than one subsequent operator in the data-flow graph and may be thought of as a common subexpression. As such, it is essential that it be computed explicitly, which it would not be were the operator contained within a tree that is rearranged. There is no attempt in the context of the invention to optimize the choice of common subexpressions, assuming such a choice is available.

In step 3 of the method depicted in FIG. 3, the modified data-flow graph is rescheduled to earliest possible schedule in terms of clock cycles of duration. Except for the latencies of multiple-input operators having their latencies computed by a method described further on in this specification, this rescheduling is done using the techniques described in the above-referenced Hartley and Jasica paper. This results in the multiple-input operators receiving inputs that are likely to be subject to differential delays between them.

In step 4 of the FIG. 3 method the modified data-flow graph is further modified after rescheduling by replacing each multiple-input operator with a tree of dual-input operators of like type which tree has minimal latency and has the least shim delay possible for that minimal latency. In order to perform these further modifications of the modified data-flow graph, routines for converting multiple-input operators to trees of dual-input operators with minimum delay are required. Such routines will presently be considered in detail.

In step 5 of the method depicted in FIG. 3 the further modified data-flow graph is subjected to linear programming for generating a final data-flow graph in which shim delays are minimized, which final data-flow graph describes the revised network of operators that the silicon compiler is to lay out.

In the end step 6 of the method depicted in FIG. 3 the silicon compiler constructs the revised computational network in accordance with the final data-flow graph.

FIG. 4 shows in subfigures (a), (c), (d) and (e) steps taken to construct a minimum-delay tree of dual-input adders with appropriate shim delays, proceeding from a representative multiple-input adder 30 with output operand Y, as shown in subfigure (a). The multiple-input adder 30 of subfigure (a) has five input operands E, F, G, H and J having respective ready times 0, 1, 1, 2 and 3 in terms of clock cycles after the earliest of the input operands to the adder. The dual-input adder from which the tree is to be constructed has a latency of one, so that if its summand input operands have relative scheduled times both zero its sum output operand has a relative ready time of one, it is postulated.

A routine for constructing trees in accordance with the invention obtains when the input operands of the operator from which the tree is to be constructed are arranged to be ready at the same time.

ROUTINE FOR GENERATING A MINIMUM-DELAY TREE OF DUAL-INPUT OPERATORS TO REPLACE A MULTIPLE-INPUT OPERATOR:

Given a first multiple-input operator with m distinct input operands ready at times $t_1, t_2, t_m$, where $t_k$ is never earlier than $t_{(k-1)}$, an equivalent tree structure of dual-input operators, each with an output operand ready at time d after its first and second input operands concurrently become ready, can be constructed by a subroutine to be described, which subroutine is iterated (M−1) times. The $k^{th}$ one of these (m−1) iterations proceeds as follows.

The two earliest ready inputs of the $k^{th}$ multiple-input operator, on which the $k^{th}$ subroutine is practiced, are selected to be input operands to a $k^{th}$ dual-input operator;

if one of the input operands to the $k^{th}$ dual-input operator is earlier ready than the other, it is provided shim delay to align it temporally with the other;

the ready time of the output operand of the $k^{th}$ dual-input operator respective to the remaining, non-selected input operands is calculated;

if k is less than (m−1), a remnant $(k+1)^{th}$ plural-input operator is defined, having as input operands the output operand of the $k^{th}$ dual-input operator and the non-selected input operands of the $k^{th}$ multiple-input operator and if k is (m−1), the output operand of the $k^{th}$ dual-input operator is the output operand of the fully constructed tree.

Figure 4A:
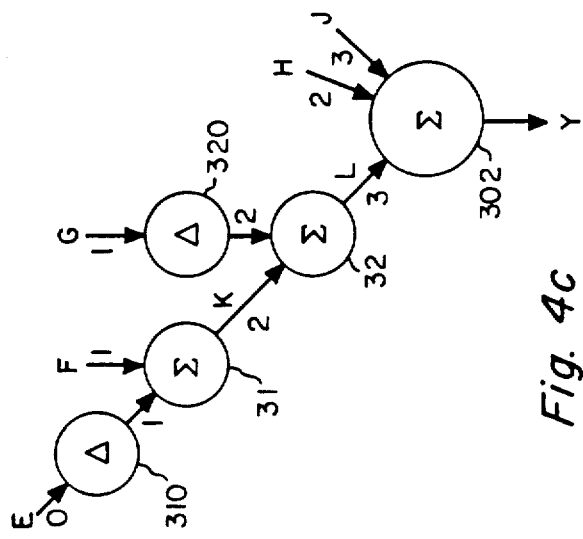
FIG. 4d is a diagram showing a multiple-input adder and FIGS. 4b, 4c, 4d and 4e are diagrams illustrating the steps for constructing, in accordance with aspects of the invention, a tree of dual-input adders that has minimal latency and shim delay.

The routine is applicable to dual-input adders, having summed input operands with relative scheduled times both zero, and having a sum output operand with relative ready time of one, as used in constructing an adder tree equivalent to the FIG. 4(a) multiple-input adder. One will note in FIG. 4(a) that the two earliest of its input operands E, F, G, H and J are E with ready time of zero and either F or G with ready time of one. E and F are selected as the two earliest input operands.

Figure 4B:
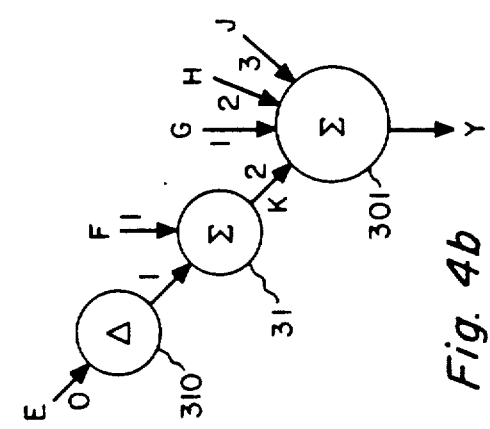

FIG. 4(b) shows the modified network after the first subroutine in the tree construction procedure is completed. In this modified network the two earliest input operands E and F are applied to a dual-input adder 31, with a unit-clock-cycle delay operator 310 having been introduced for E input operand to align the E and F input operands for application to adder 31 at schedule time one. The ready time of the output operand K of adder 31 is two, a unit clock cycle later than the ready time of its input operands. Output operand K and the non-selected input operands G, H and J provide input operands to a remnant plural-input adder 301, which provides output operand Y after the first subroutine is completed. The input operands G, H, J and K have respective ready times one, two, three and two. The very earliest of these operands is G; and the next earliest operand is either H or K.

Figure 4C:
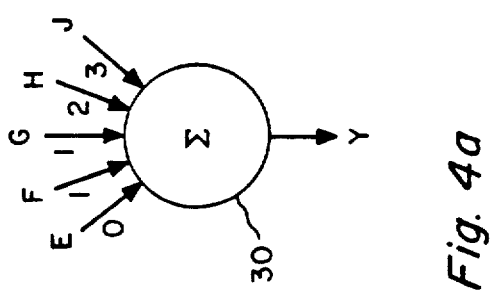

FIG. 4(c) shows the modified network after the second subroutine in the tree construction procedure is completed. The input operands G and K are selected as earliest and are applied to a dual-input adder 32, with a unit-clock-cycle delay element 320 having been introduced to delay input operand G so it is aligned with input operand K for application to the adder 32 at schedule time two. The ready time is three for the output operand L supplied from adder 32. A remnant multiple-input adder 302 receives operand L as an input operand together with remaining input operands H and J. The input operands L, H and J for the remnant adder 302 have respective ready times of three, two and three. Operand H is the earliest ready, and either of operands L and J is the next earliest.

Figure 4D:
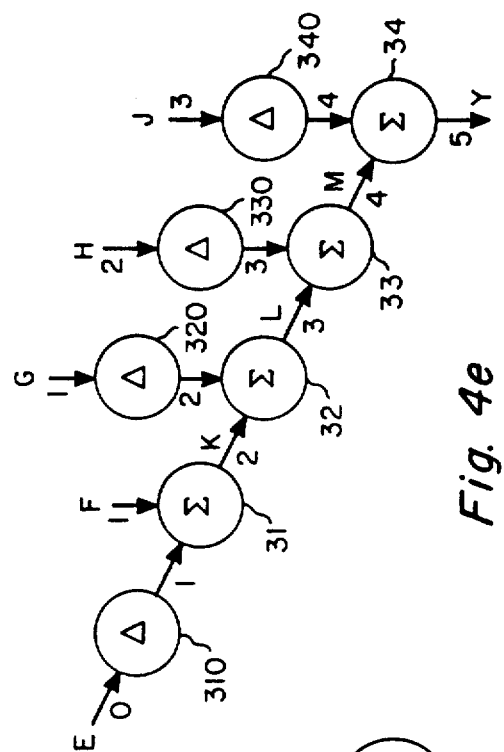

FIG. 4(d) shows the modified network after the third subroutine of the tree construction procedure is completed. H and L have been chosen as earliest input operands and are applied to a dual-input adder 33, with a unit-clock delay operator 330 having been introduced to align the H and L input operands for application to adder 33 at schedule time three. The ready time of operand M output from adder 33 to a remnant adder 303 is four. Only two input operands, M and J, are available to the remnant adder 303. Since remnant adder 303 is a dual-input adder there is no fourth subroutine to be followed.

Figure 4E:
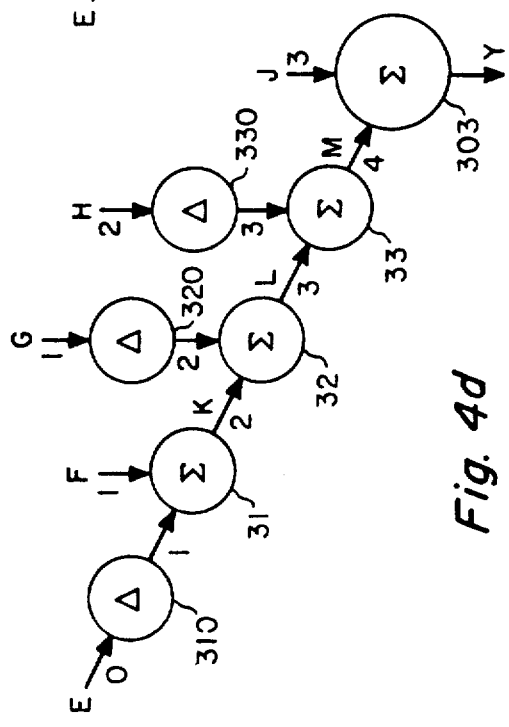

Rather, as shown in FIG. 4(e) remnant adder 303 is replaced by a dual-input adder 34 for receiving temporally aligned input operands M and J. A unit-clock-delay operator 340 is inserted to delay input operand J so as to be temporally aligned with input operand M. Adder 34 output operand Y has a ready time of five.

FIG. 5 shows an alternative tree structure that can be achieved by the special subroutine proceeding from the multiple-input adder 30 as shown in FIG. 5(a). In constructing this alternative tree structure E and G are selected as the two earliest input operands to adder 30.

FIG. 5 shows the modified network after the first subroutine in the tree construction procedure is completed. In this modified network the two earliest input operands E and G are applied to a dual-input adder 35, with a unit-clock-cycle delay operator 350 having been introduced to align temporally the E and G input operands for application to adder 35 at schedule time one. The ready time of the output operand N of adder 35 is two, a unit clock cycle later than its input operands. After the first subroutine is completed, output operand N and the non-selected input operands F, H and J provide input operands to a remnant plural-input adder 305, which provides output operand Y. The input operands F, H, J and N have respective ready times one, two, three and two. The very earliest of these operands is F; and the next earliest operand is either H or N.

FIG. 5(c) shows the modified network after the second subroutine in the tree construction procedure is completed. The input operands F and N selected as earliest are applied to a dual-input adder 36, with a unit-clock-cycle delay element 360 having been introduced to delay input operand F so it is aligned with input operand N for application to the adder 36 at schedule time two. The ready time is three for the output operand P supplied from adder 36. A remnant multiple-input adder 306 receives operand P as an input operand and together with remaining input operands H and J. The input operands P, H and J for the remnant adder 306 have respective ready times of three, two and three. Operand H is the earliest ready, and either of operands L and J is the next earliest.

FIG. 5(d) shows the modified network after the third subroutine of the tree construction procedure is completed. H and J have been chosen as earliest input operands and are applied to a dual-input adder 37, with a unit-clock delay operator 370 having been introduced to align the H and J input operands for application to adder 37 at schedule time four. The ready time of operand Q output from adder 37 to a remnant adder 307 is four. Only two input operands, P and Q, are available to the remnant adder 307. Since remnant adder 307 is a dual-input adder there is no fourth subroutine to be followed.

Rather, as shown in FIG. 5(e), remnant adder 307 is replaced by a dual-input adder 38 for receiving temporally aligned input operands P and Q. A unit-clock-delay operator 380 is inserted to delay input operand P so as to be temporally aligned with input operand Q. Adder 34 output operand Y has a ready time of five.

The fact that the special routine described above constructs a tree with minimal latency and shim delay can be proven. Moreover, a proof can be made that a more general routine will construct a tree with minimal latency and shim delay, and the routine described above can be shown to be a species of such more general routine. The presumption is that the dual-input operators from which the tree is constructed are of a type wherein each dual-input operator accepts its two input operands concurrently. The proof that a general routine exists to minimize latency and shim delay simultaneously is contained in the following three paragraphs.

Any step of combining two input operands to a multiple-input operator generates a replacement operand to be combined with the remaining operands. So m−1 steps of combining two operands are necessary in any tree for combining m input operands. The total amount of delay in the branches of the tree is the sum of: firstly, the product of (m − 1) times the latency of a dual-input operator and, secondly, the shim delay. Since the first term is fixed, the shim delay is minimized by reducing the total amount of delay in the branches of the tree.

Any step of combining two operands must take place at a time no earlier than the time both are ready. If a step of combining two operands takes place at a scheduled time later than the ready time of the later operand, each input operand has to be delayed by a time equal to the difference between its ready time and the scheduled time which delay is provided by delay for each input operand. If the operation can be rescheduled to be earlier in time, delay must be provided to the output operand if there is a desire to keep the same time that operand is applied to a succeeding operator, but the same amount of delay can be removed from each of the two input operands. This provides a net saving in the amount of required delay and removes delay entirely from the later input operand. So, to minimize net delay, and thus net shim delay, any operation of combining two operands should be rescheduled to be as soon after the ready time of the later operand as is possible. Such rescheduling, per se, does not affect the latency of the completed tree structure.

To keep latency at a minimum in a tree structure composed of dual-input operators each accepting its input operands concurrently, at each successive clock cycle available as a schedule time, as many operations as can be done at that time should be done. Each clock cycle that two available operands are left uncombined means that their combination together either directly or indirectly after being combined with others has to be postponed a clock cycle. Unless there is shim delay in the tree after the combination of the operands which permits the later combination without increase in the latency of the tree network, that latency will have to be increased because of the two available operands having been left uncombined. The desirability of combining pairs of operands as early as possible to minimize latency is harmonious with the desirability of combining pairs of operands as early as possible to minimize the need for shim delay.

Some comments in regard to the foregoing proof may be helpful to the reader. While rescheduling the combination of two operands to occur earlier in time (as described in the second paragraph back) does not of itself affect the latency of the network, such rescheduling may result in shim delay for the output operand of the network. The shim delay may be subsequently dispensed with in some cases, in order to reduce the latency of the tree.

The only time an operand cannot be combined in an operator scheduled at its ready time is when there is no other operand ready to be combined with. This occurs only when there is an odd number of operands that become available for combining at a time. One operand must be left uncombined while any other operands are paired for combination, and sufficient shim delay must be provided that left-over operand so that it can be utilized in an operation scheduled at a later time.

The proof that the special routine for constructing a tree with minimal latency and shim delay is included as a special case of the general routine is contained in this paragraph. Since the dual-input operators in the tree are presumed to be of a type where the input operands are to be temporally aligned, it is of no consequence which operand is left over during a clock cycle after as many pairs of ready operands are combined as possible. An earlier ready operand has to be shimmed to be temporally aligned with the later ready operand(s) to be available for the pairing process, whether that earlier ready operand is combined or is left over; and then the operand left over after combining pairs will have to be provided shim delay in order to be utilized in an operation scheduled at a later time, whether or not it is the later ready operand that is left over. In a tree of dual-input operators the input operands of which are to be temporally aligned, then, minimum latency and shim delay is assured if during each clock cycle, any left over operand from a previous clock cycle is provided shim delay to make it currently available, and as many pairs as possible of currently available operands are combined.

The process of combining each pair of earlier ready operands introduces delay in the signal path these operands follow to reach the terminus of the network, which improves temporal alignment of these operands with later ready operands with which they will subsequently combine; so there is lessened need for shim delay. A desire is to provide the differential delays needed for temporally aligning earlier ready operands with the later ready operands using the operator delays as much as possible and shim delays as little as possible. The combination of as many pairs of operands as ready at a given time satisfies this desire, as well as avoiding the need for having to provide separate shim delays for operands that could instead be combined so their combination could be delayed with savings in net shim delay.

If one reduces a multiple-port operator by iteratively extracting the two of its input operands that are earliest ready, following the routine used in FIGS. 4 and 5 to generate a tree of dual-input operators, one invariably extracts each of the pairs of operands available at a former ready time before progressing from that former ready time to the next ready time, carrying forward with a shim delay as a further output operand any leftover operand that was available but could not be paired in the ready time, in addition to each output operand generated by an operator combining a pair of operands. This subroutine meets the conditions of the foregoing proof with regard to dual-input operators of a type where the input operands are to be temporally aligned, and this subroutine is simply implemented in a silicon compiler.

FIG. 6 illustrates the procedure of generating a minimum delay tree of dual-input operators, each simultaneously accepting its input operands, by combining pairs of last ready operands at each schedule time until there is one or no left-over operand. This routine is somewhat more difficult to implement in the silicon compiler than the routine described earlier and practiced in FIGS. 4 and 5, so is not preferred.

Subfigure (a) of FIG. 6 shows once again the multiple-input adder 30 having input operands E, F, G, H and J with respective ready times of zero, one, two and three. At schedule time zero only input operand E is ready and no combination of input operands is possible, so operand E is left over.

Subfigure (b) of FIG. 6 shows input operands F and G being combined in a dual-input adder 45 with schedule time one, to generate an output operand with ready time 100. Input operand F and G are the two last ready operands ready at time one, each having a ready time of one, while input operand E is ready earlier at time zero. No further combinations can be made at schedule time one since only operand E is left for combination, so again operand E is left over. A remnant multiple-input adder 405 receives V, E, H and J as input operands.

Subfigure (c) of FIG. 6 shows operands U and H that are the last of adder 405 input operands ready at schedule time two being combined in a dual-input adder 46 to generate an output operand V ready at time three. The earliest ready operand E is again left over, since there are no other input operands to remnant adder 405 ready at schedule time two. A remnant multiple-input adder 406 receives U, E and J as its input operands.

Subfigure (d) of FIG. 6 shows operands V and J that are the last ready of adder 406 input operands ready at schedule time three being combined in a dual-input adder 47 to generate an output operand W ready at time four. The earlier ready operand E is again left over, since there are no other input operands to remnant adder 406 ready at schedule time three. A remnant plural-input adder 407 receives W and E as input operands.

Subfigure (e) of FIG. 6 shows operand E with ready time zero being provided four clock cycles of delay $4\Delta$ by a delay operator 480 to align it temporally with operand W at schedule time four. The temporally aligned operands E and W are combined in a dual-input adder 48 to generate at time five an output operand that is the response of the fully constructed tree. Note that the latency of the FIG. 6(e) tree is five clock cycles just as in the FIG. 4(e) and FIG. 5(e) trees. Note also four unit-clock-cycle shim delays are required in each of these trees.

FIG. 7 illustrates two trees of dual-input subtractors and trees combining adders and subtractors may be treated in accordance with the invention. Any such tree can be converted to a tree of adders with unary minus operators for selected ones of its input operands, using the following routine.

ROUTINE FOR CONVERTING A TREE OF ADDERS AND SUBTRACTORS TO A TREE OF ADDERS WITH UNARY MINUS OPERATOR(S) FOR SELECTED INPUT OPERATOR(S)
While not finished:
BEGIN;
find an operator $O_4$ that is a dual-input subtractor receptive of minuend and subtrahend input operands;
if $O_4$ has a fan-out equal to one, and if the fan-out is to an operator $O_5$ that is a dual-input subtractor or a plural input adder, delete operator $O_4$, replacing it with a unary minus operator $O_6$ and an operator $O_7$ that is a dual-input adder, the unary minus operator $O_6$ receiving as its input operand the subtrahend input operand of the operator $O_4$ being replaced and supplying its output operand as the addend input operand of the operator $O_7$, which operator $O_7$ receives as its augend input operand the minuend input operator of the operator $O_4$ being replaced;
END.
Then, when not finished
BEGIN;
find an operator $O_8$ that is a plural-input adder with a unary minus operator for its output operand;
replace the unary minus operator with a direct connection;
insert a unary minus operator for each input operand of the operator $O_8$. Then, while not finished:
BEGIN;
find each unary minus operator that directly succeeds (or, in an alternative procedure, directly proceeds) another unary minus operator and replace the two of them with a direct connection;
END.

Subfigure (a) of FIG. 7 shows a tree of dual-input operators 51–57. Operators 52, 55 and 56 are subtractors having + signs near their minuend input operands and having − signs near their subtrahend input operands. Operators 51, 53, 54 and 57 are adders, each having + signs near both its addend input operator and its augend input operator (arbitrarily assumed to be relatively left and relatively right respectively). Input operands A, B and C have ready times of zero and input operands D, E, F, G and H have ready times of one. The output operand X has a ready time four. Delay operators 491, 492 and 493 each provide a respective unit-clock-cycle delay; and delay operators 494 and 495 each provide a respective two-clock-cycle delay.

Subfigure (b) of FIG. 7 shows the equivalency of a subtractor 50 to a connection of an adder 58 and a unary minus operator 59. The unary minus operator used in the minimum-delay tree construction procedures does not correspond to an actual circuit element, but is a "pseudo-operator" employed solely to keep track of the sign of an operand and thereby implement the silicon compiler modifying the network. The unary minus operator is considered to have zero latency and not to introduce delay for the operand upon which it is considered to operate.

Subfigure (c) of FIG. 7 shows the equivalency of a dual-input adder 68 with a unary means operator 69 for its output operand to that dual-input adder 68 with no unary minus operator for its output operand and with unary minus operators 78 and 79 for each of its input operands. This equivalency is used in the tree reduction steps that lead to the FIG. 7(e) tree and subsequently the FIG. 7(f) tree.

Figure 7A:
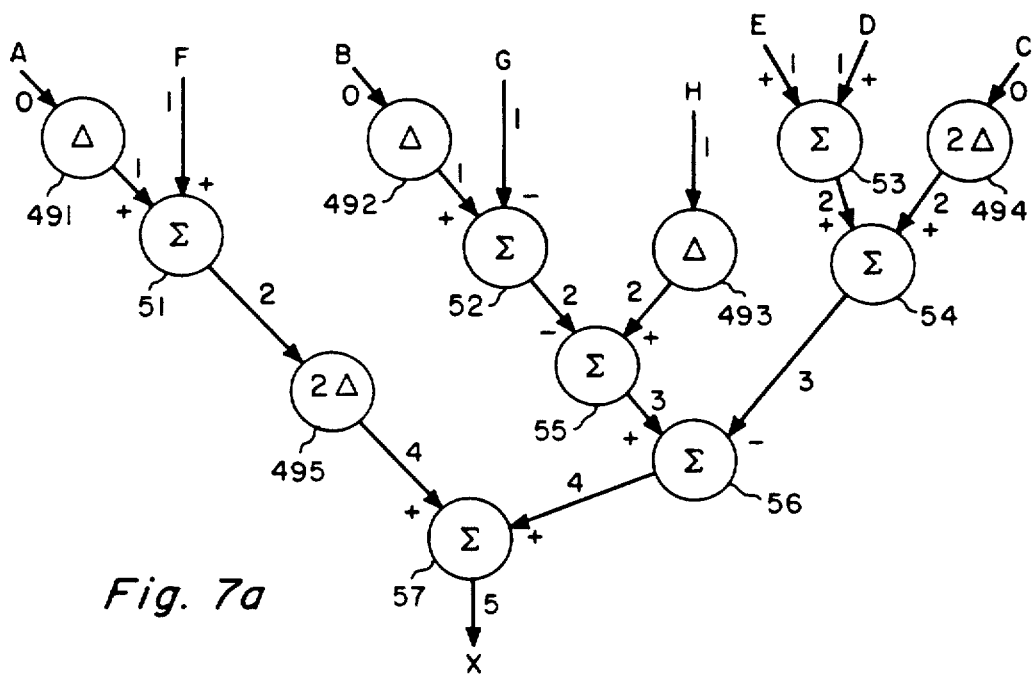
FIG. 7a is a diagram showing a tree of adders and subtractors.
Figure 7B:
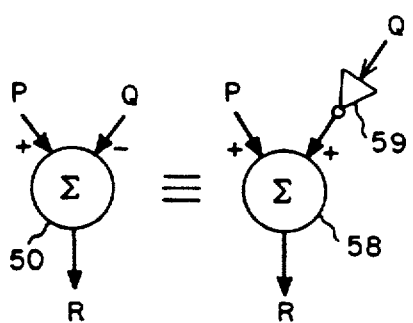
FIGS. 7b, 7c, 7d and 7e and 7f are diagrams illustrating the steps for constructing in accordance with an aspect of the invention a multiple-input adder with unary minus operators for selected ones of its input operands as shown in FIG. 7g.
Figure 7C:
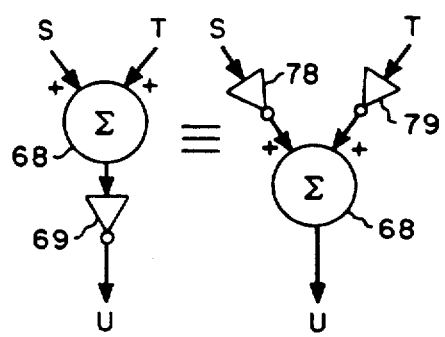
Figure 7D:
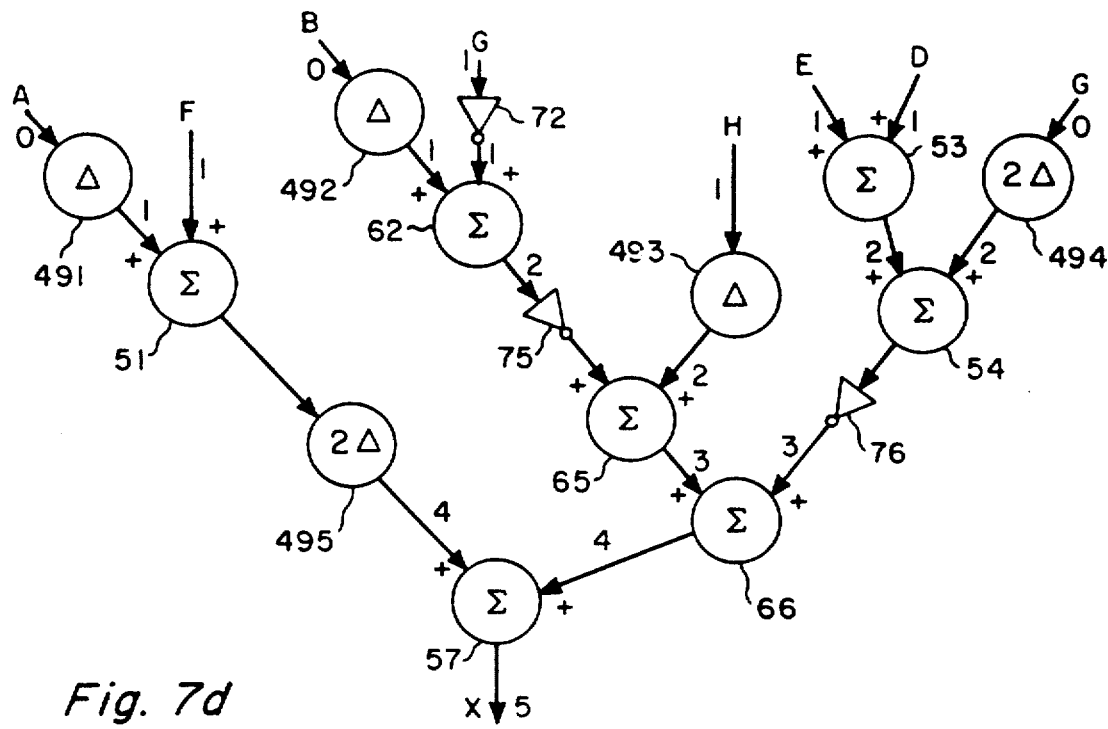

Subtractors 52, 55 and 56 of the FIG. 7(a) tree are replaced by their equivalents according to FIG. 7(b) to obtain the FIG. 7(d) tree of adders and unary minus operators. In FIG. 7(d) subtractor 52 is replaced by adder 62 and unary minus operator 72; subtractor 55 is replaced by adder 65 and unary minus operator 75; and subtractor 56 is replaced by adder 66 and unary minus operator 76.

Figure 7E:
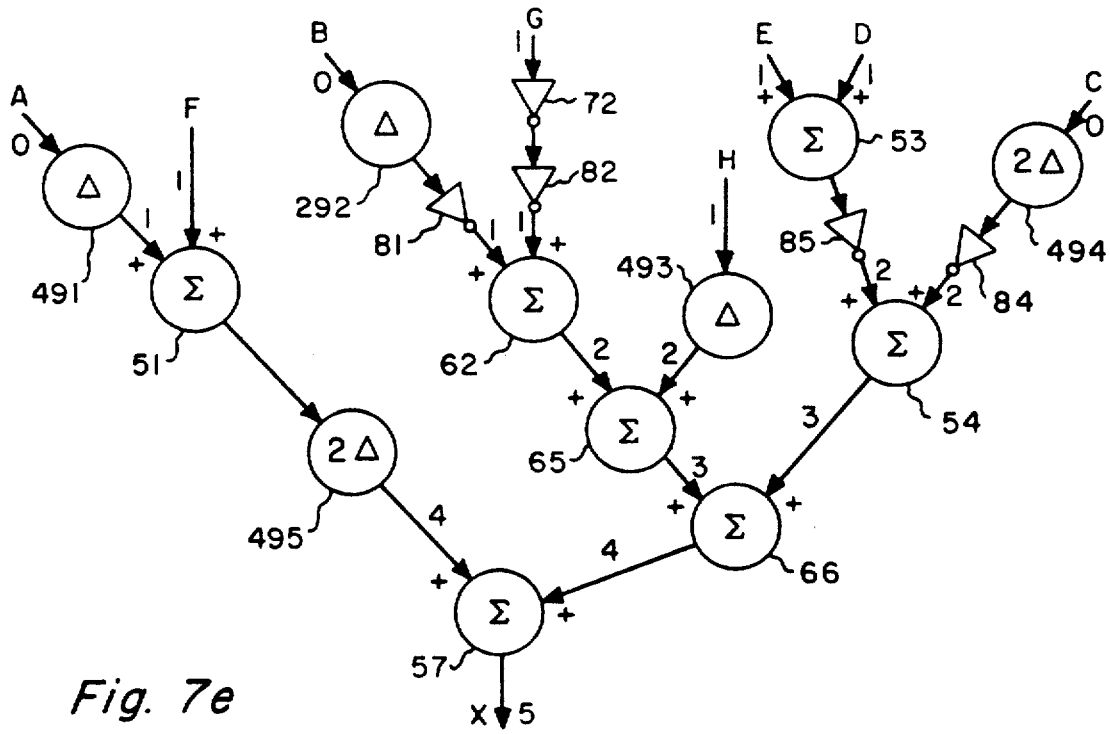

In FIG. 7(e) unary minus operator 75 for adder 62 output operand is replaced by direct connection, and unary minus operators 81 and 82 are provided for respective input operands of adder 62. Unary minus operator 76 for adder 54 output is replaced by direct connection, and unary minus operators 84 and 85 are provided for respective input operands of adder 54.

Figure 7F:
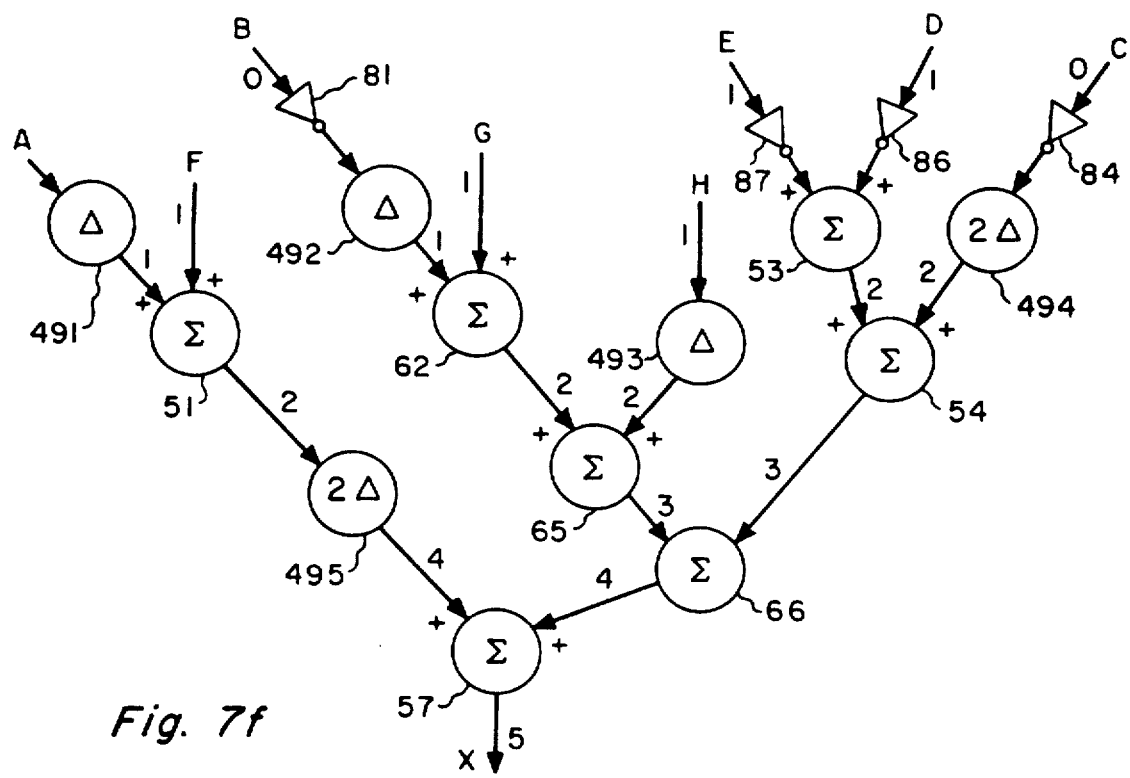

In FIG. 7(f) the unary minus operator 85 for the output operand of adder 53 is replaced by a direct connection, and unary minus operators 86 and 87 are provided for input operands D and E respectively. The unit-clock-cycle delay operator 492 and the unary minus operator 81 are rearranged in their cascade connection with each other, so input operand B is applied to minus unary operator 81 and the resulting −B operand is then applied to the delay operator 492. The pair of successive unary minus operators 72 and 82 for input operand G are replaced by a direct connection. The modified network now comprises a tree of dual-input adders certain input operands of which (B, C, D and E) are provided with respective unary minus operators 81, 84, 86 and 87.

Figure 7G:
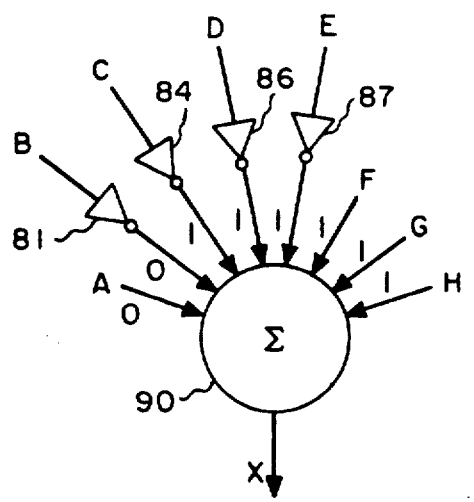

In FIG. 7(g) the tree of dual input adders is replaced by a multiple-input adder 90. The ROUTINE FOR CONVERTING A TREE OF ADDERS AND SUBTRACTORS TO A TREE OF ADDERS WITH UNARY MINUS OPERATOR(S) FOR SELECTED INPUT OPERAND(S) illustrated in FIG. 7 is in effect a way of counting how many times an input operand and terms of which it is a subterm are is used as a subtrahend input operand in a path stretching to the output port of the tree and beginning from the input port of the tree to which that input operand is applied. In carrying out the routine to the point where each operator $O_R$ with a unary minus operator for its output operand has unary minus operators provided for its input operands instead, the number of unary minus operators for each input operand counts how many times that input operand and terms of which it is a subterm are subtrahends. In completing the routine with the subroutine to replace cascade pairs of unary minus operators with direct connections, the count is converted to a modulo two form. After the multiple-input adder 90 is converted to a minimum-delay tree of dual-input adders, the minus unary operators for certain of its input operands can be assimilated back into the tree using the equivalencies shown in subfigures (c) and (b) of FIG. 8 as inverse transforms to relocate the minus unary operators vis-a-vis certain of the dual-input adders in the tree, such that no adder has more than one minus unary operator for its summand input operands, and such that each adder with one minus unary operator in a summand input operand thereof and that minus unary operator are replaced by a respective subtractor.

FIG. 8 illustrates the routine for converting a network that includes the multiple-input adder 90 with unary minus operators 81, 84, 86 and 87 for its input operands B, C, D and E to a minimum-delay tree consisting of dual-input adders and subtractors. It is assumed that the adder and subtractor have similar latencies. Subfigure (a) of FIG. 8 corresponding to subfigure (g) of FIG. 7 shows the network to be converted to the minimum-delay tree of adders and subtractors. Subfigures (b), (c) and (d) of FIG. 8 shows the results of performing the procedures of the ROUTINE FOR GENERATING A MINIMUM-DELAY TREE OF DUAL-INPUT OPERATORS TO REPLACE A MULTIPLE-INPUT OPERATOR for successive schedule times.

Figure 8C:
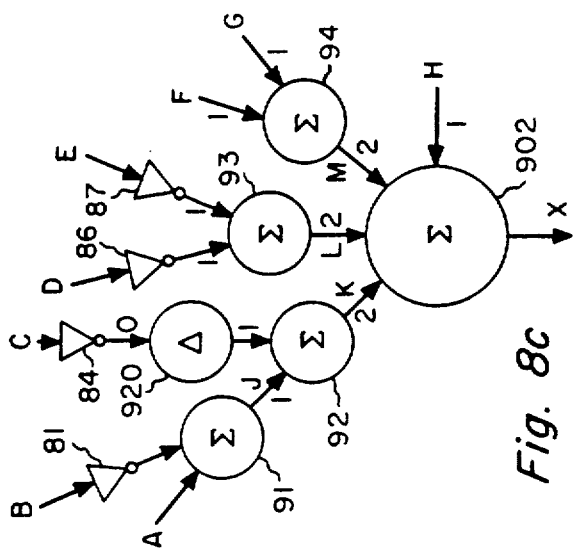
FIGS. 8b, 8c, 8d and 8e are diagrams illustrating the steps for constructing in accordance with an aspect of the invention a minimum-delay tree of adders and subtractors as shown in FIG. 8f.
Figure 8B:
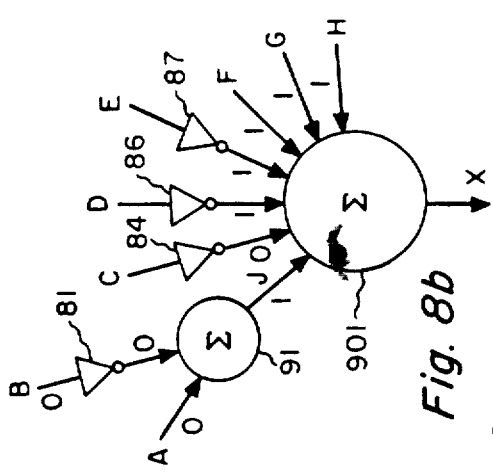

FIG. 8(b) shows that at schedule time zero when only input operands A, —B and —C of adder 90 are ready, the A and —B operands are selected for combination in a dual-input adder 91 generating an output operand J with a ready time one. Operand C is left over. Operand J and the remaining input operands —C, —D, —E, F, G and H are supplied to a remnant multiple-input adder 901. FIG. 8(b) shows that at schedule time one, when operands J, —C, —D, —E, F, G and H are all ready, three pairs of operands can be combined in respective adders 92, 93 and 94. The —C operand is provided unit-clock-cycle shim delay Δ by a delay operator 920, so it can be combined with operand J in adder 92 at schedule time one, generating a sum operand K with a ready time two. The —D and —E operands are added in an adder 93 generating a sum operand L with ready time two. The F and G operands are added in an adder 94 generating a sum operand M with ready time two. Operand H is left over. Operands K, L, M and H are applied as input operands to a remnant multiple-input adder 902 which generates an output operand X.

Figure 8A:
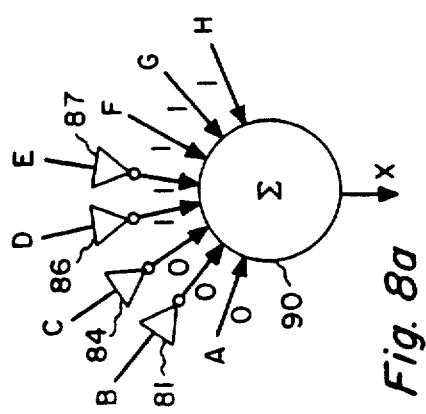
FIG. 8a is a diagram showing a multiple-input adder with unary minus operators for selected ones of its input operands.
Figure 8D:
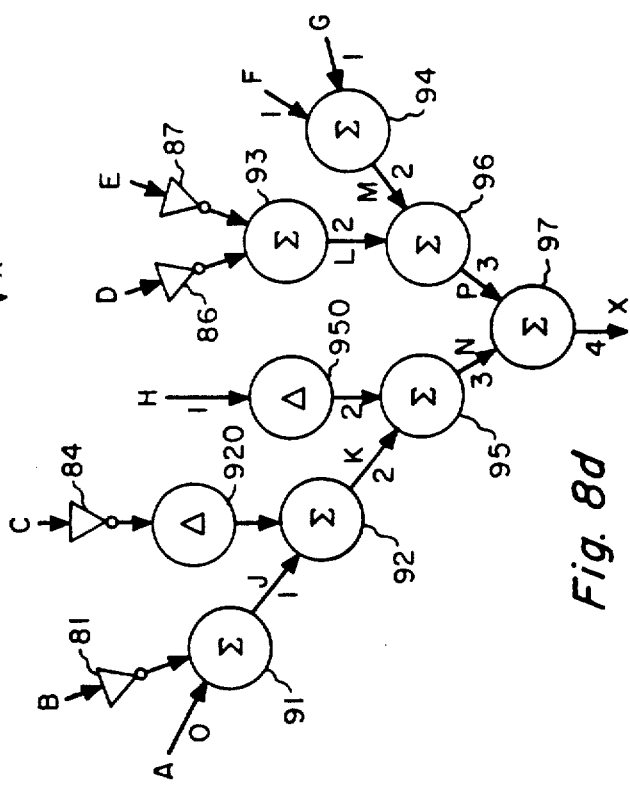
Figure 8E:
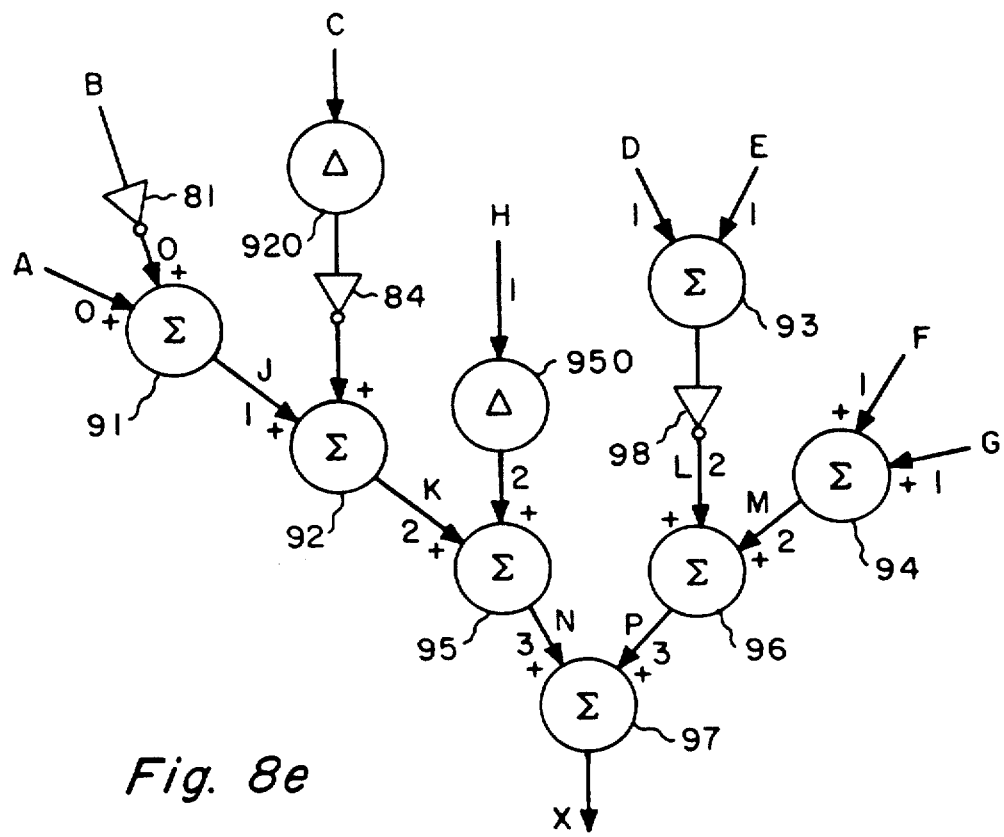

FIG. 8(d) shows that at schedule time two, when operands K, L, M and H are all ready, two pairs of combinations are possible. Operand H is provided one-clock-cycle shim delay Δ by a delay operator 950 and is added at schedule time two to operand K in an adder 95, to generate a sum operand N with ready time three. Operands L and M are added together at schedule time two in an adder 96 to generate a sum operand P with ready time three. FIG. 8(d) further shows that at schedule time three an adder 97 adds together N and P to generate output operand X for the adder tree, which operand X has a ready time four.

Subfigures (e) and (f) of FIG. 8 illustrate the procedure for re-assimilating the unary means operators 81, 84, 86 and 87 back into the tree using inverse transform procedures based on the equivalencies shown in subfigures (c) and (b) of FIG. 7. More particularly, FIG. 8(e) shows the replacement of each adder having a respective unary minus operator for each of its input operands with an adder having a unary minus operator only for its output operand, using the equivalency shown in FIG. 8(c) as an inverse transform. Specifically, the unary minus operators 86 and 87 for the input operands of adder 93 are replaced by direct connections, and a unary minus operator 98 is provided for the output operand of adder 93. FIG. 8(e) also shows the rearrangement of unary minus operators and delay operators in cascade arrangements thereof to place the delay operators before the minus unary operators, which rearrangement is attempted after each inverse transformation based on the FIG. 7(c) equivalency. This is a "shaking down" procedure that relocates the unary minus operators as close to the output port of the tree as possible and invariably results in no dual-input adder in the tree having unary minus operator for more than one of its input operands. More specifically, the positions of unary minus operator 84 and of delay operator 920 are transposed going from subfigure (d) to subfigure (e) of FIG. 8.

Figure 8F:
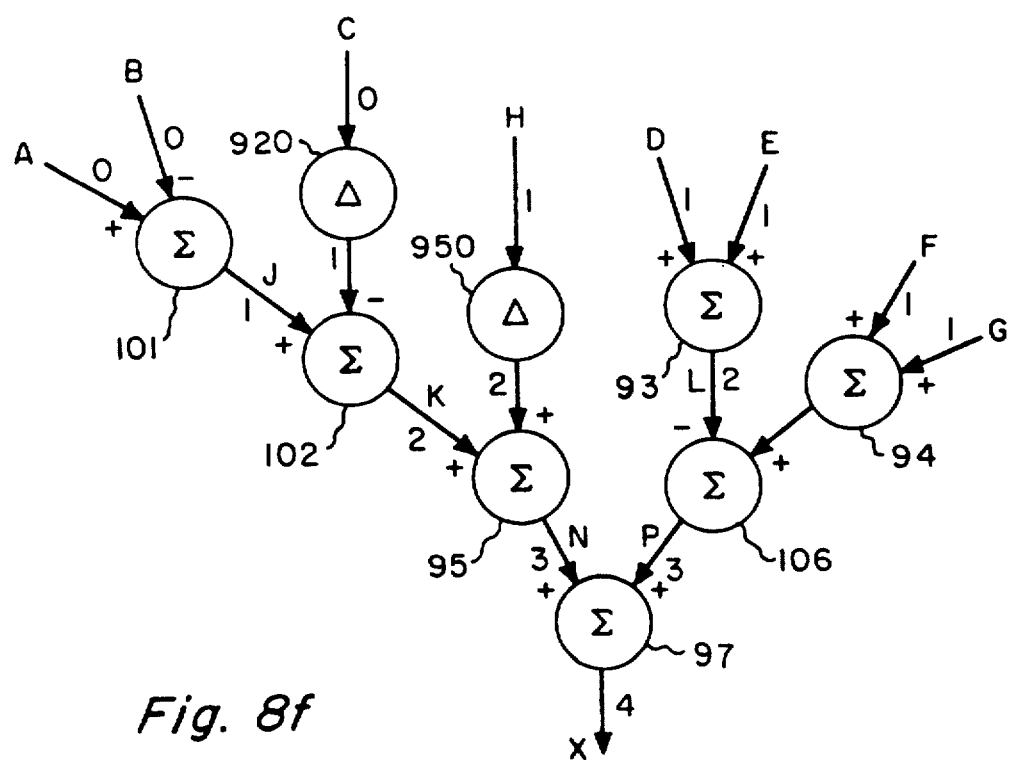

FIG. 8(f) shows the final tree network resulting form each adder with a unary minus operator for one input operand being replaced by a subtractor to eliminate the need for the unary minus operator. Adder 91 and unary minus operator 81 are replaced by a subtractor 101 to eliminate the need for the unary minus operator. Adder 92 and unary minus operator 84 are replaced by subtractor 102. Adder 96 and unary minus operator 98 are replaced by a subtractor 106. The minimum-delay tree of FIG. 8(f) has latency of four as compared to the latency five of the FIG. 7(a) tree, symptomatic of the fact the FIG. 8(f) tree has minimum latency. The minimum-delay tree of FIG. 8(f) has only two unit-clock-cycle shim delays provided by delay operators 920 and 950 as compared to the three unit-clock-cycle shim delays provided by delay operators 491, 492 and 493 and two two-clock-cycle shim delays provided by delay operators 494 and 495 in the original FIG. 7(a) tree. This is a saving of five clock cycles of total shim delay.

The routine illustrated in subfigures (e) and (f) of FIG. 8 can be formally expressed as follows.

ROUTINE FOR CONVERTING A TREE OF ADDERS WITH UNARY MINUS OPERATOR(S) FOR SELECTED INPUT OPERAND(S) TO A TREE WITH ELEMENTS THAT ARE EACH AN ADDER OR SUBTRACTOR:

While not finished, perform the following first subroutine:

BEGIN;

find a cascade connection of a unary minus operator $O_9$ followed by a delay operator $O_{10}$ with no interposing operator;

reverse the positions of operators $O_9$ and $O_{10}$ in their cascade connection so the delay operator $O_{10}$ is followed by the unary minus operator $O_9$;
END.
Then, while not finished, perform the following second subroutine:
BEGIN;
find an adder $O_{11}$ having unary minus operators $O_{12}$ and $O_{13}$ for each of its input operands;

provide a unary minus operator $O_{14}$ for the output operand of adder $O_{11}$;

replace each of the unary minus operators $O_{12}$ and $O_{13}$ by a respective direct connection.
END.
Then, unless no adder $O_{11}$ was found in the foregoing performance of said second subroutine, repeat said first subroutine.
Then, while not finished, perform the following final subroutine:
BEGIN;
find an adder $O_{15}$ having a unary minus operator $O_{16}$ for one of its input operands;

replace operators $O_{15}$ and $O_{16}$ with a subtractor $O_{17}$, receiving as its subtrahend input operand the input operand of the replaced unary minus operator $O_{16}$, and receiving as its minuend input operand the input operand that adder $O_{15}$ did not receive from unary minus operator $O_{16}$;
END.

The foregoing routine provides a convenient way for the silicon compiler in effect to keep track of the signed arithmetic for the operands to be combined at each step of tree construction, selecting an adder when two positive input operands are to be combined to generate a positive output operand or when the negative input operands are to be combined to generate a negative output operand, and selecting an appropriately connected subtractor when one of the two input operands is positive and the other negative to generate a positive output operand. Using the foregoing routine postpones the decisions as to whether each dual-input operator in the tree is to be an adder or a subtractor until the tree is constructed. This facilitates omitting the routines for dealing with subtractors when it is known they are not needed to augment the routine for constructing the minimum-delay tree of dual-input operators. It is useful to describe the eliminating of excess delay from trees of adders and subtractors in terms of separate routines for converting such trees to adder trees for optimizing the adder trees and for connecting the adder trees to trees of adders and subtractors, since it makes clear that the problems of delay minimization and calculating minimum latency to implement scheduling are separable from the problem of deciding whether to employ an adder or subtractor to combine terms.

Rather than using adders or subtractors as the associative and commutative operators in tree construction, multipliers or dividers that accepts input operands concurrently can be constructed using bit-serial (or digit-serial) to bit-parallel converters for each input operand together with read-only-memory addressed by the bit of the input operands to generate an output operand, in bit-parallel form. This output operand can then be converted back to the original form of its input operands. Dividers do not have commutative input operands, so a special procedure must be followed to convert a tree of dividers or of multipliers and dividers to a tree of multipliers certain input operands of which have reciprocal-taking operators inserted therein. The reciprocal taking operator is a pseudo-operator employed in converting division operations to multiplication operations in a manner analogous to the way another pseudo-operator, the unary minus operator, is employed in converting subtraction operations to addition operations.

Often, however, a multiplier or a divider generates a product by arithmetic procedures and is of a type that accepts its input operands at staggered times. Minimization of the latency of trees of dual-input operators receiving their input operands at staggered times is possible, as well as the subsequent minimization of shim delay for the minimum-latency tree. However, the procedures for constructing these trees are considerately more complex than the procedures for constructing trees of dual-operators each receiving its input operands concurrently. These more complex procedures can be usefully employed, however, in step 4 of the FIG. 3 method (and in step 5 as well, where loops are involved).

The applicability of the invention to multipliers, dividers adders and subtractors individually makes it clear that the invention is applicable to arithmetic systems where each number is considered to be the product of two factors, a first factor that is a binary number with a leading ONE in a prescribed bit place and a second scaling factor that is a power of two. The first factor is used in normal binary computation procedures and the logarithm base two of the second factor is used for adjustments of scale. Cascade multiplications are often performed using this arithmetic system. Minimum-delay trees of multipliers for combining the first factors of numbers can be constructed in accordance with the invention, and minimum-delay trees of adders and subtractors for combining the second factors of numbers can be constructed in accordance with the invention.

Figure 9:
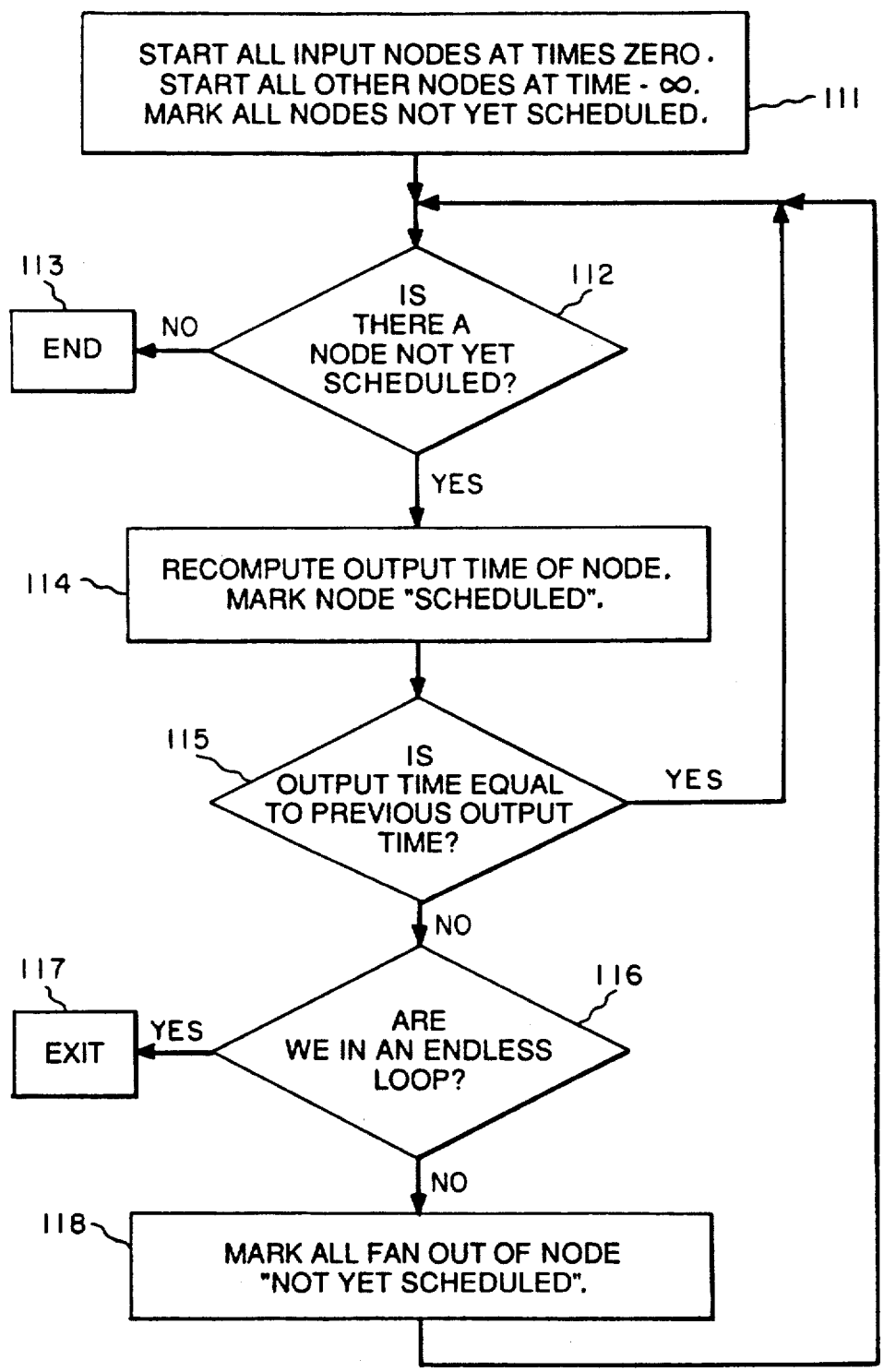
FIG. 9 is a flowchart depicting in greater detail the step in the FIG. 3 flowchart of determining earliest schedule for the electrical network.

FIG. 9 is a flowchart depicting in greater detail the step in the FIG. 3 data-flow chart of determining earliest schedule for the electrical network. The "nodes" in the data-flow chart correspond to respective operators. Scheduling is done in this procedure with reference to the time that an operator output operand is ready, from which a schedule time in reference to the time the last operator input operand is ready may be easily inferred. In the start step 111 all input nodes are scheduled at time zero and all other nodes are scheduled at a time in the distant past, which is not particularly crucial. A theoretical negative value that can be justified as sufficiently distant in the past is the total of the absolute values of all the latencies of all operators in the computational network. All nodes are marked "not yet scheduled".

In the step 112 the decision is made whether there is any node marked "not yet scheduled" which there is until the determination of earliest schedule for all nodes (or operators) is complete and the end step 113 is taken. Assuming a node marked "not yet scheduled" is found the output time for that node (or operator) is recomputed in step 114 and the node is marked "scheduled". The recomputed output time of the node in step 115 compared to its output time just prior to the recomputation. If it is equal, the previous schedule of the node is unaffected and there is no need to change the scheduling of fan-out nodes (subsequent operators), and there is a return to step 112.

If the recomputed time is later, a step 116 to determine if the program is in an endless loop condition is taken, which step can be implemented as described in the Hartley and Jasica paper already incorporated herein by reference. A finding that the system is an endless loop leads to an exit with failure step 117. This will occur only if the system is such that no scheduling is possible and is not symptomatic of a weakness in the analytical approach. A finding the system is not in an endless loop condition causes, in a step 118, all nodes to which fans out the node that has been recomputed to be marked "not yet scheduled". After step 118, step 112 is returned to.

The step 114 of recomputation is carried out exactly as described in the Hartley and Jasica paper already incorporated herein by reference for all nodes or operators that are not a multiple-input operator that can be realized in different topologies, as described above in connection with the invention. In the case of such a multiple-input operator, its latency can be affected by changes in the ready times of its input operands, as should be evident from the previous descriptions of the tree construction procedures. For each change in the ready times of its operands, the minimum latency of the multiple-input operator has to be re-calculated. This can be done using the minimum-delay tree construction in procedures described earlier, although the software of the compiler may permit these procedures to be done in a more abstract form to simplify calculations. That is, the computation can be done without actually expanding the multiple-input operator.

Figure 10:
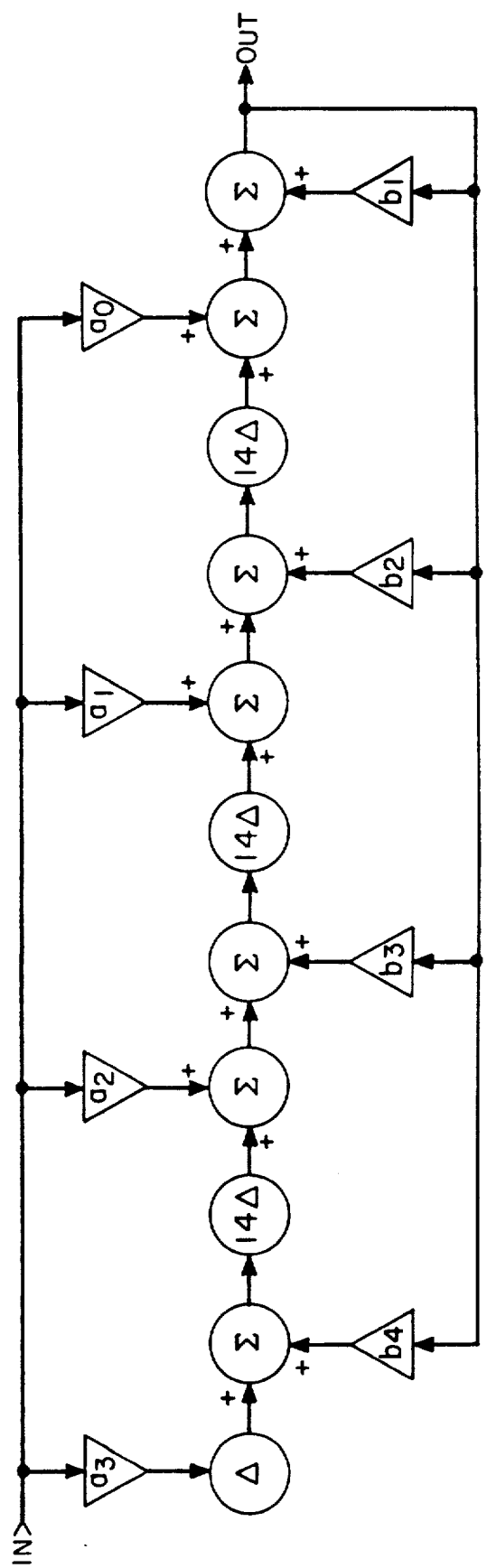
FIG. 10 is a schematic diagram of a bit-serial recursive filter designed by a silicon complier using a method in accordance with an aspect of the invention.

FIG. 10 is a schematic diagram of a recursive bit-serial digital filter described by the following equation.

$$y = a_o{}^*x - a_1{}^*x\{-1\} - a_2{}^*x\{-2\} - a_3{}^*x\{-3\} - b_1{}^*$$
$$y\{-1\} - b_2{}^*y\{-2\} - b_3{}^*y\{-3\} - b_4{}^*y\{-4\}$$

Each adder in the FIG. 10 filter has a latency of one clock cycle, and each constant multiplier has a latency of fifteen clock cycles, each word having a duration of sixteen clock cycles. The FIG. 10 filter is designed by a silicon compiler programmed in accordance with the invention. Note it is critical that the addition of the $b_1{}^*y\{-1\}$ term appear last in the adder tree or the feedback loop will be too long. The total of forty-three clock cycles of shim delay is the least possible, and the latency time of seventeen clock cycles of shim delay is the shortest possible.

While the trees constructed in accordance with the inventions have as thus far considered been comprised of dual-input operators, modifications are possible to permit the use of multiple-input operators. More particularly, three-input adders and three-input adder/subtractors that process three inputs received at the same time and that have latencies similar to a two-input adder or subtractor are feasible. Such three-input operators permit any plural number of simultaneously ready operands to be combined, even odd plural numbers of operators, so shim delay is required only when just one operand is ready at a given time. Latency can be shortened when the three-input operator is available. Six input operands can be combined in two cycles of operation, rather than three, for example. At each successive time as many operands as may be combined are combined. This is done using as many three-input operators as possible. If two remanant operands are left at a given time, they are combined in a dual-input operator. If one remnant operand is left at a given ready time, one three-input operator is converted to a dual-input operator and another dual-input operator is used to combine the pair of remnant operands.

Figure 11A:
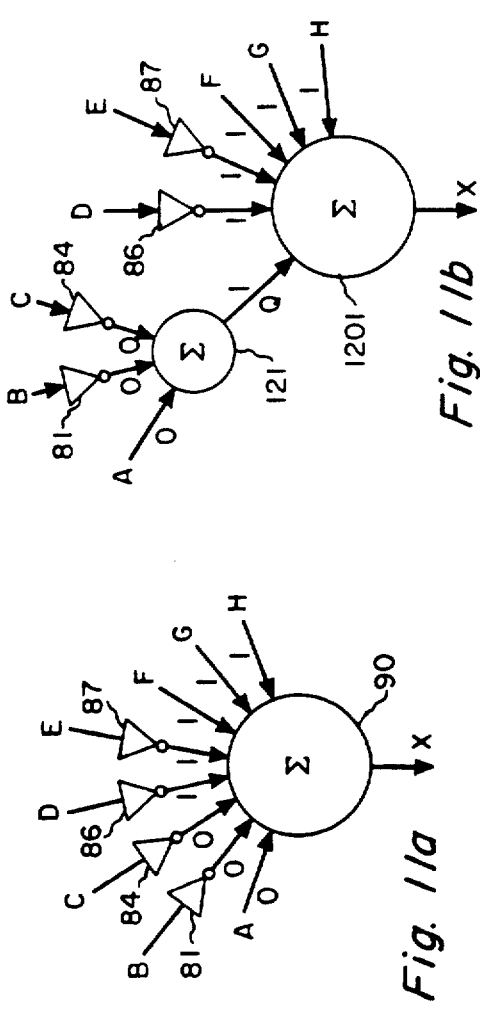
FIG. 11a is a diagram showing a multiple-input adder with unary minus operators for selected ones of its input operands.

FIG. 11(a) like FIG. 8(a) shows multiple-input adder 90 with minus unary operators 81, 84, 86 and 87 for selected ones of its input operands. The remaining subfigures (b), (c), (d), and (e) of FIG. 11 illustrate how a minimum-delay tree of three-input and dual-input operators can be constructed. Both types of operators are assumed by way of example to have a latency of one.

Figure 11B:
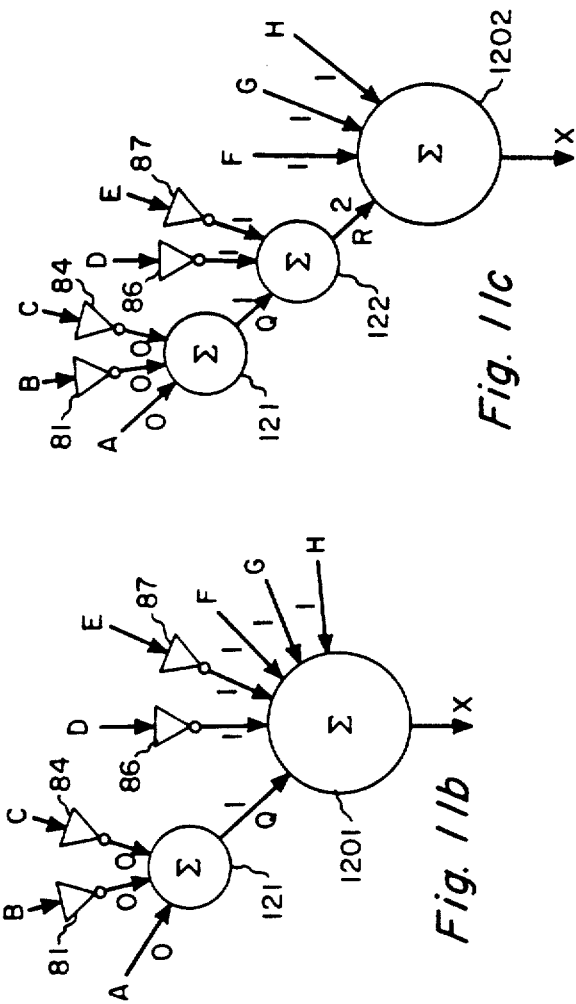
FIGS. 11b, 11c, 11d and 11e are diagrams illustrating the steps for constructing in accordance with an aspect of the invention a minimum-delay tree of adder/subtractors as shown in FIG. 11e.

As shown in FIG. 11(b), at ready time zero, three operands are ready -i.e. A, B as negatived by minus unary operator 81, and C as negatived by by minus unary operator 84. These operands are combined in a three-input adder 121 to generate an operand Q with a ready time of one. Operand Q and the remaining input operands of replaced multiple-input adder 90 are supplied to a remnant plural-input adder 1201 to generate the output operand.

Figure 11C:
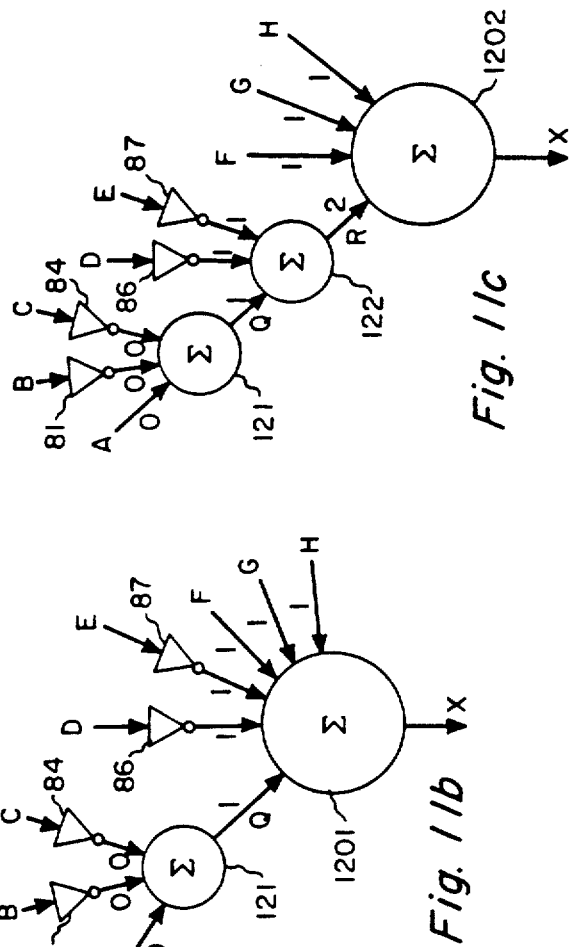

As shown in FIG. 11(c), at ready time one, operand Q, operand D as negatived by minus unary operator 86 and operand E as negatived by minus unary operator 87 are selected as input operands for a three-input adder 122, to generate an output operand R with a ready time of two. Operand R and the remaining input operands F, G and H are supplied as input operands to a remnant plural-input adder 1202 to generate output operand X.

Figure 11D:
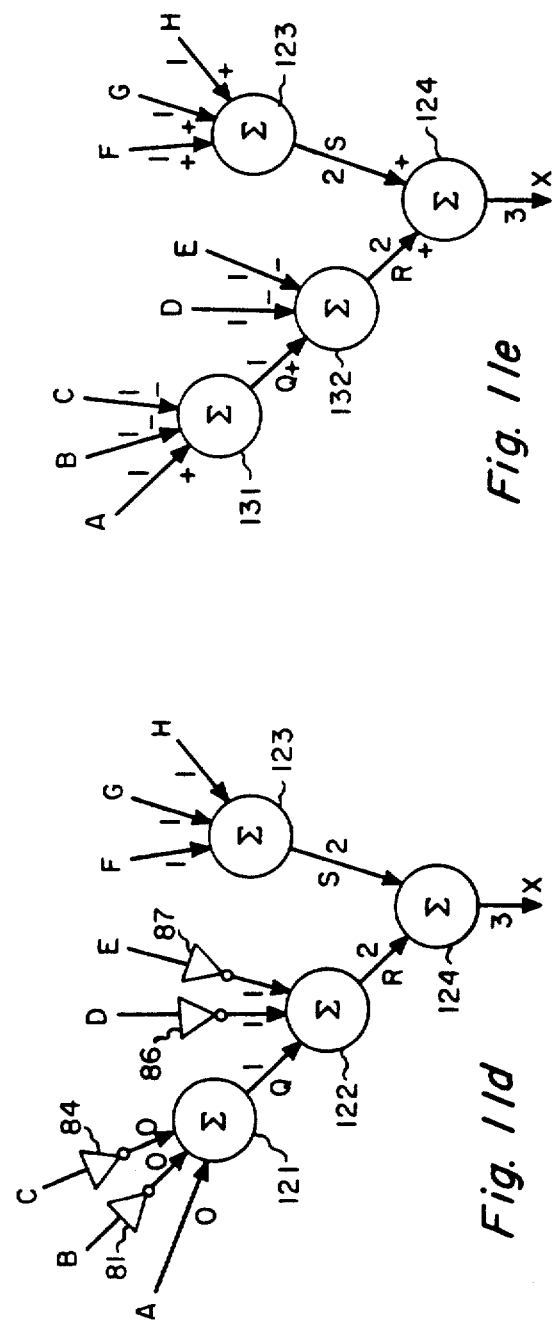

As shown in FIG. 11(d), also at ready time one, input operands F, G and H are selected as input operands for another three-input adder 123, to generate an output operand S with a ready time of two. Since the operands R and S are both ready at time two, they can be combined in a two-input adder 124, as also shown in FIG. 11(d), to generate the output operand X with ready time three.

Figure 11E:
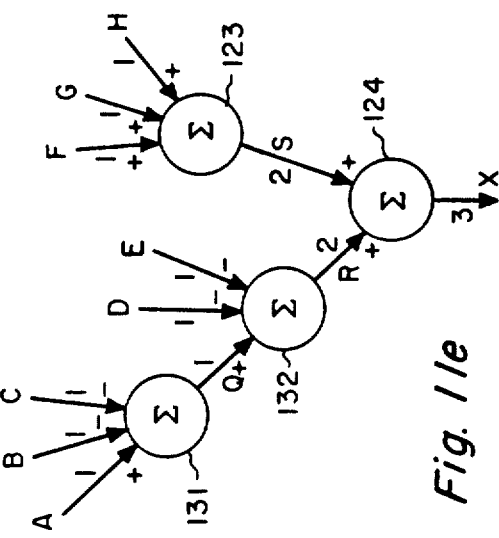

FIG. 11(e) shows the minus unary operators 81, 84, 86 and 87 having been subsumed into the three operators. Three-input adders 121 and 122 are replaced by three-input operators that subtractively combine with a first operand the sum of second and third operands. Comparing the final tree structure of FIG. 11(e) with that of FIG. 8(f), the use of three-input as well as dual-input operators permits a shortened latency of three clock cycles, rather than four, and eliminates two unit-clock-cycle shim delays.

Although the invention is particularly well-suited to bit-serial and digit-serial pipelined architectures, it can be adapted for use in word-parallel pipelined architecture for digital computation, in which the bits of each data word are furnished parallel in time. In such an architecture the pipeline is considered to be of sufficient "cross-section" as to encompass all parallel computations. Clocked, or synchronous, data latches with bit positions for the bits of each data word in the pipeline (a plurality of words where parallel computations are involved) are interposed at positions in the pipeline. The clocked data latches provide for synchronous data flow through the pipeline. Between each pair of successive synchronous data latches, there is combinational logic for carrying out one or more arithmetic or logical operations on a non-synchronous basis. All operations carried out between a pair of successive synchronous data latches must have cumulative execution times shorter than a single clock cycle.

The usual desire is to reduce the length of time it takes to execute all computations in such a pipeline. One approach that can be taken in the design of a word-parallel pipeline is to introduce synchronous data latches after each successive arithmetic or logical operation, or parallel set of such operations, the clocking rate for the latches being chosen to accommodate the longest execution interval for any operation. In such an approach the analogy to bit-serial and digit-serial operation is clear. The restructuring of trees of similar dual-input operators to minimum latency tends to reduce the number of successive clocked data latches required in the pipeline. The elimination of shim delay corresponds to a diminuation of the number of bit places required in certain of the synchronous data latches to provide delaying of an operand until it can be used in an arithmetic or logical operation. This approach is not the one that provides shortest latency through the pipeline, however, because the time required for a specific number of clock cycles becomes substantially longer than the actual time for executing that number of operations. Every operation has to be spaced from the proceeding operation by at least a minimum-duration protection interval in this clocking procedure to assure that all data are ready when the synchronous data latches are updated by clocking, so latency is increased by the sum of these minimum-duration protection intervals.

A preferably approach to take in the design of a word-parallel pipeline is to execute a plurality of successive non-synchronous operations between synchronous data latches, so only a single minimum-duration protection interval need be provided after their execution rather than a summation of such protection intervals having to be provided for this plurality of operations. This often permits the clocking cycle frequency to be chosen somewhat higher than it could be if the period for doing the plurality of operations had to include more than one protection interval and, of course, shortens the latency of the pipeline. Furthermore, where the execution time for a particular iterated dual-input operator is shorter than the longest execution time for any operator, a cascade connection of more of the iterated dual-input operators can be fitted between two successive synchronous data latches in the pipeline, than could be fitted into a similar time interval in a pipeline where the result of each successive operation is synchronized by a respective clocked data latch. The latency of trees of dual-input operators is measured in terms of cumulative execution times for the individual operations, rather than clock cycles, in the computer-aided design of a pipeline where successions of non-synchronous operations are done during each interval of synchronous operation.

In such a pipeline, reduction of the latency of a tree in terms of execution intervals tends to reduce the latency of the pipeline in terms of clock cycles. For example, where three successive additions can be done per clock cycle, reducing the latency if an adder tree from seven execution intervals to five will shorten pipeline latency from three clock intervals to two. Reducing the latency of an adder tree from seven execution intervals to six will also shorten pipeline latency form three clock intervals to two. Reducing the latency of an adder tree from six execution intervals to five does not shorten the latency of the pipeline from two clock intervals. In any of the examples minimizing tree latency provides no bit-width saving in the final synchronous data latch.

Another approach that can be taken in the design of a word-parallel pipeline is to execute all operations in a tree during one clocking interval of two synchronous data latches respectively proceeding and succeeding the tree. In this type of pipeline minimizing the latency of the tree in terms of execution intervals allows the clocking rate to be chosen higher, with a concomitant reduction in pipe latency. The method of reducing latency in a tree of operations can also be used to minimize execution time in a tree of operations in non-synchronous digital circuitry, of course.

One skilled in the art will be enabled by acquaintance with the foregoing disclosure to devise alternative methods to those presently preferred methods herein disclosed and this should be borne in mind when constructing the scope of the claims which follow.

What is claimed is:

1. A computer-aided design method for restructuring a computational network comprised of operators, in order to reduce delay in the network, said computational network including at least one tree connection of operators of similar type having plural inputs and combining sampled data supplied to these inputs in accordance with a prescribed processing operation that is both associative and commutative in nature to generate a sampled-data result at an output thereof, said restructuring method comprising the silicon compiler implemented steps of:

generating a data-flow graph descriptive of the computational network prior to its restructuring, said data-flow graph including operators having respective scheduled times and operands having respective ready times;

modifying said data-flow graph to generate a modified data-flow graph, by searching out each plural-input operator of a said type having a fan-out equal to one to another operator of similar type, by replacing those plural-input operators with one equivalent multiple-input operator receiving the same sampled-data input signals and supplying the same ultimate sampled-data output signal, and by continuing this replacing procedure until it can no longer be performed;

rescheduling said modified data-flow graph for earliest schedule;

modifying said rescheduled modified data-flow graph to generate a further-modified data-flow graph, by using for each multiple-input operator of a said type a routine of replacing such a multiple-input operator with a respective tree of dual-input operators having minimal latency, each dual-input operator being similar in type to the multiple-input operand it helps replace and supplying an output operand that exhibits specified latencies with respect to each of its input operands;

generating a final data-flow graph based from said further modified data-flow graph by reducing shim delay where applicable in said further modified data-flow graph; and converting said final data-flow graph to a restructured computational network of operators, those operators of each said type being dual-input operators.

2. The method of claim 1 wherein said step of reducing generating a final data-flow graph based from said further modified data-flow graph by reducing shim delay where applicable in said further modified data-flow graph is carried out using linear programming.

3. The method of claim 1 wherein each said routine to replace a multiple-input operator of said one type with a respective tree of dual-input operators having minimal latency employs dual-input operators the output operand of each of which has a latency of $\delta$ clock cycles with respect to each of its operands, of being a positive integer, and wherein each said routine comprises the steps of:

performing a subroutine at each successive ready time beginning with the earliest ready time of any input operand to said multiple-input operator, which subroutine comprises the substeps of:

arranging in pairs the then ready ones of said input operands and each output operand of the preceding said subroutine, if any, with one operand being left over when the number of such operands is odd;

combining each said pair of operands thus arranged in a respective dual-input operator of said one type, with specified latency of δ, thereby to generate a respective output operand for the subroutine; and delaying any left-over operand using a shim delay element with said specified latency thereby to generate a further output operand for the subroutine; and halting any further performing of said subroutine after a single output operand is generated by a subroutine.

4. A restructured computational network designed by a silicon compiler using the method of claim 3.

5. A restructured computational network as set forth in claim 4 wherein said one tree connection of operators comprises adder elements.

6. A computer-aided design method for restructuring a computational network comprised of operators, said restructuring method comprising the silicon compiler implemented steps of:

generating a data-flow graph descriptive of the computational network prior to its restructuring, said data-flow graph including operators having respective scheduled times and operands having respective ready times;

replacing in said data-flow graph each plural-input operator of a type that performs an associative but not commutative operation upon sampled data suppled to it as respective input operands, with a plural-input operator of another type that performs an associative and commutative operation upon sampled data supplied to it as respective input operands which associative and commutative operation is complementary to the operation of the replaced plural-input operator, and with a respective pseudo operator operative on each of a selected number of the input operands of said replaced operator as applied as input operands to said plural-input operator of another type that replaces said replaced operator;

replacing in said data-flow graph each network of operators of another type and pseudo operators with a network of operators of said other type with all pseudo operators removed to its input operands;

modifying said data-flow graph with any replacements made therein in accordance with the foregoing steps, to generate a modified data-flow graph, by searching out each plural-input operator of having a fan-out equal to one to another operator of similar type, by replacing those plural-input operators with one equivalent multiple-input operator receiving the same sampled-data input signals and supplying the same ultimate sampled-data output signal, and by continuing this replacing procedure until it can no longer be performed;

rescheduling said modified data-flow graph for earliest schedule;

modifying said rescheduled modified data-flow graph to generate a further-modified data-flow graph, by using for each multiple-input operator a routine of replacing such a multiple-input operator with a respective tree of dual-input operators having minimal latency, each dual-input operator being of similar type and supplying an output operand exhibiting specified latencies with respect to each of its input operands;

for each respective tree of dual-input operators in said further-modified data flow graph, reabsorbing pseudo operators in its input operands, so no more than one pseudo operator appears in the input operands of any dual-input operator in that tree;

replacing in each respective tree of dual-input operators a dual-input operator with a pseudo operator in one of its input operands, inserting in their place an equivalent dual-input operator that performs an associative but not commutative operation upon sampled data applied to it as respective input operands that is complementary to the associative and commutative operation provided by the dual-input operator it replaces;

generating a final data-flow with any replacements made therein in accordance with the foregoing step, by reducing shim delay where applicable; and converting said final data-flow graph to a restructured computational network of operators.

7. A restructured computational network designed by a silicon compiler using the method of claim 6.

8. A restructured computational network as set forth in claim 7 wherein operators of a type that performs an associative but not commutative operation are subtractor elements; and wherein operators of another type that performs an associative and commutative operation that is complementary to the operation of said subtractor elements are adder elements.

9. A method used in computer-aided design of computational networks, to construct a tree of dual-input operators for replacing a multiple-input operator, each of said operators being of a type for combining sampled data received at its inputs, in accordance with a processing operation that is associative and commutative in nature, to generate a sampled-data result at an output thereof; which tree of dual-input operators is to be embodied in a computational apparatus; said method comprising the computer implemented steps of:

specifying with respect to a scheduled time for said multiple-input operator a ready time for each input operand to said multiple-input operator;

performing a subroutine at each successive ready time beginning with the earliest ready time of any of said input operands, which subroutine comprises the substeps of:

arranging in pairs the then ready ones of said input operands and each output operand of the preceding said subroutine, if any, with one operand being left over when the number of such operands is odd;

combining each said pair of operands thus arranged in a respective dual-input operator with specified latency, thereby to generate a respective output operand for the subroutine, and delaying any left-over operand using a shim delay element with said specified latency, thereby to generate a further output operand for the subroutine; and halting any further performing of said subroutine after a single output operand is generated by a subroutine.

10. A method used in computer-aided design of computational networks to construct a tree of dual-input operators for replacing a multiple-input operator, each of said operators being of a type for combining sampled data received at its inputs, in accordance with a processing operation that is associative and commutative in nature, to generate a sampled-data result at an output thereof; which tree of dual-input operators is to be embodied in a computational apparatus; said method comprising the computer implemented steps of:

specifying with respect to a scheduled time for said multiple-input operator a ready time for each input operand to said multiple-input operator;

performing a subroutine for replacing said multiple-input operator with a respective dual-input operator and with a remnant plural-input operator with one less input operand than the multiple-input operator; and performing further subroutines for replacing any remnant plural-input operator from a preceding said subroutine until a remnant plural-input operator that is a dual-input operator is achieved having an output operand that is the output operand of the fully constructed tree, any further said subroutine being identified by a consecutive ordinal number corresponding to its order in any succession of subroutines beginning with said first subroutine, each said subroutine comprising the substeps of:

selecting two input operands of the operator to be replaced by the subroutine which have the earliest ready time or ready times specified therefor;

providing a respective dual-input operator for combining the two selected input operands to supply after a latency period an output operand from that dual-output operator, which selected two input operands retain their respective ready times;

specifying a ready time for the output operand of the dual-input operator provided by the foregoing substep, which ready time increments the ready times of its input operands by its latency period; and where there is at least one remaining input operand to the operator to be replaced which is not one of the two selected output operands in the subroutine, defining a remnant plural-input operator for the subroutine that has as its input operands said remaining input operands and the output operand of said dual-input operator combining the two input operands selected in said subroutine, with ready times as already specified.

11. A computer-aided design method for restructuring a computational network comprised of operators, in order to reduce delay in the network, said computational network including at least one tree connection of operators of similar type having plural inputs and combining sampled data supplied to these inputs in accordance with a prescribed processing operation that is both associative and commutative in nature to generate a sampled-data result at an output thereof, said restructuring method comprising the computer implemented steps of:

generating a data-flow graph descriptive of the computational network prior to its restructuring, said data-flow graph including operators having respective scheduled times and operands having respective ready times;

modifying said data-flow graph to generate a modified data-flow graph, by searching out each plural-input operator of a said type having a fan-out equal to one to another operator of similar type, by replacing those plural-input operators with one equivalent multiple-input operator receiving the same sampled-data input signals and supplying the same ultimate sampled-data output signal, and by continuing this replacing procedure until it can no longer be performed;

rescheduling said modified data-flow graph for earliest schedule;

modifying said rescheduled modified data-flow graph to generate a further-modified data-flow graph, by using for each multiple-input operator of a said type a routine of replacing such a multiple-input operator with a respective tree of operators having minimal latency, each operator in the tree being a dual-input or three-input operator, being similar in type to the multiple-input operand it helps replace and supplying an output operand that exhibits specified latencies with respect to each of its input operands;

generating a final data-flow graph based from said further modified data-flow graph by reducing shim delay where applicable in said further modified data-flow graph; and converting said final data-flow graph to a restructured computational network of operators, those operators of each said type being dual-input or three-input operators.

12. The method of claim 11 wherein said step of reducing generating a final data-flow graph based from said further modified data-flow graph by reducing shim delay where applicable in said further modified data-flow graph is carried out using linear programming.

13. The method of claim 11 wherein each said routine to replace a multiple-input operator of said one type with a respective tree of dual-input operators having minimal latency employs dual-input and three-input operators the output operand of each of which has a latency of $\delta$ clock cycles with respect to each of its operands, of being a positive integer, and wherein each said routine comprises the steps of:

performing a subroutine at each successive ready time beginning with the earliest ready time of any input operand to said multiple-input operator, which subroutine comprises the substeps of arranging in triples the then ready ones of said input operands and each output operand of the preceding said subroutine, if any, with either one operand or two operands being left over when the number of such operands is not evenly divisible by three;

where two operands are left over, combining them in a respective dual-input operator of said one type, with specified latency of $\delta$, thereby to generate a respective output operand for that subroutine;

where one operand is left over and at least one triple of other operands has been arranged, combining the operands of said one triple and the left over operand on a pairwise basis in respective dual-input operators of said one type, with specific latency of $\delta$, thereby to generate respective output operands for that subroutine;

combining each remaining said triple of operands thus arranged in a respective three-input operator of said one type, with specified latency δ, thereby to generate a respective output operand for the subroutine;

delaying any left-over operand using a shim delay element with said specified latency thereby to generate a further output operand for the subroutine; and halting any further performing of said subroutine after a single output operand is generated by a subroutine.

14. A restructured computational network designed by a silicon compiler using the method of claim 13.

15. A restructured computational network as set forth in claim 14 wherein said one tree connection of operators comprises adder/subtractor elements.

* * * * *